US009558301B1

(12) United States Patent
Orqueda et al.

(10) Patent No.: US 9,558,301 B1
(45) Date of Patent: *Jan. 31, 2017

(54) MODEL-TO-DATA AND DATA-TO-MODEL TRACEABILITY

(71) Applicant: The MathWorks, Inc., Natick, MA (US)

(72) Inventors: Omar Armando Adrian Orqueda, Cambridge, MA (US); Christian Patrick Grippo, Cambridge, MA (US); Robert O. Aberg, South Grafton, MA (US)

(73) Assignee: The MathWorks, Inc., Natick, MA (US)

( * ) Notice: Subject to any disclaimer, the term of this patent is extended or adjusted under 35 U.S.C. 154(b) by 767 days.

This patent is subject to a terminal disclaimer.

(21) Appl. No.: 13/965,921

(22) Filed: Aug. 13, 2013

Related U.S. Application Data

(63) Continuation of application No. 12/720,117, filed on Mar. 9, 2010, now Pat. No. 8,538,899.

(51) Int. Cl.
*G06F 17/00* (2006.01)
*G06N 5/00* (2006.01)
*G06F 17/50* (2006.01)

(52) U.S. Cl.
CPC ..................................... *G06F 17/50* (2013.01)

(58) Field of Classification Search
CPC .......... G06F 17/5009; G06F 8/10; G06F 8/35; G06F 17/00; G06N 5/00
USPC .......................................................... 706/45
See application file for complete search history.

(56) References Cited

U.S. PATENT DOCUMENTS

| 7,499,766 | B2 | 3/2009 | Knight et al. |
| 2003/0088809 | A1 | 5/2003 | Gulati et al. |
| 2006/0064294 | A1* | 3/2006 | Clark ................. G06F 17/5009 703/22 |
| 2007/0043622 | A1 | 2/2007 | Olsen et al. |
| 2007/0157162 | A1* | 7/2007 | Ciolfi ................. G06F 17/5009 717/105 |

(Continued)

OTHER PUBLICATIONS

The MathWorks, "Simulink, Dynamic System Simulation for MATLAB," Using Simulink, Version 3, 608 pages (1999).

*Primary Examiner* — Kakali Chaki
*Assistant Examiner* — Peter Coughlan
(74) *Attorney, Agent, or Firm* — Nelson Mullins Riley Scarborough LLP

(57) ABSTRACT

A device, method and tangible computer-readable medium are provided for detecting output discrepancies between representations of a block in two system models. For example, a first representation of a block may represent a default configuration and may execute in a first model. A second representation of the block may represent a user-modified configuration for the block and may execute in a second model. The user may execute the first and second models and may compare results using an exemplary embodiment. The embodiment may allow the user to define criteria and weightings for the criteria and to use the criteria for generating objective functions and constraints. The objective functions and constraints may be used to evaluate the performance of the two models. The embodiment may further perform trace back operations with respect to a model to determine a location in the model that produces an output discrepancy.

20 Claims, 19 Drawing Sheets

(56) References Cited

U.S. PATENT DOCUMENTS

2008/0215512 A1    9/2008  Narzisi et al.
2009/0012773 A1*  1/2009  Glass ................. G05B 19/0426
                                                          703/21

* cited by examiner

MODEL-TO-DATA AND DATA-TO-MODEL TRACEABILITY

RELATED APPLICATIONS

This application claims priority to and the benefit of U.S. application Ser. No. 12/720,117 filed Mar. 9, 2010, titled: Model-To-Data and Data-To-Model Traceability, the contents of which are incorporated herein by reference in their entirety.

BACKGROUND INFORMATION

Models may be used to simulate physical systems. For example, a graphical model may be used to represent a complex control system for a plant. The graphical model may include entities, such as blocks, that reference executable code for performing operations of the control system when the graphical model executes. The blocks can vary in type and/or number and may be connected together to build large, complex models (e.g., models including hundreds or more interconnected blocks).

In some modeling environments, users may be able to use blocks in a default configuration, such as a configuration provided by a vendor. Or, the users may be able to modify a configuration for the block to allow the block to operate in a modified manner when a model is executed. For example, a filter block may include a default filter algorithm that can be used in a first model. The user may want to compare the operation of the default filter algorithm with a modified filter algorithm created by the user. The user may modify the default filter block to include the user's algorithm and may use the modified filter block in a second model.

The user may run the first and second models side by side to compare how the models perform with respect to design criteria. When outputs for one of the models do not agree with an expected result, the user may find that it is difficult to identify the source of the error. For example, the model may include numerous blocks in addition to the filter block, and the user may be unable to determine whether a problem occurred at the output of the filter block or at the output of another block in the model.

Assume for sake of example, that the modified filter algorithm is more sensitive to a range of input values than the default filter algorithm. An output from a block that feeds the modified filter block may have an output value that causes the modified filter algorithm to behave in an unexpected manner, whereas the default filter lock operates correctly when it receives the output value. The modified filter output may then cause other blocks in the model to behave unexpectedly. Conventional modeling environments may not provide users with a way to reliably identify sources of discrepancies in models when the results from one model are compared to the results for another model.

BRIEF DESCRIPTION OF THE DRAWINGS

The accompanying drawings, which are incorporated in and constitute a part of this specification, illustrate one or more embodiments of the invention and, together with the description, explain the invention. In the drawings.

DETAILED DESCRIPTION

Figure 1:
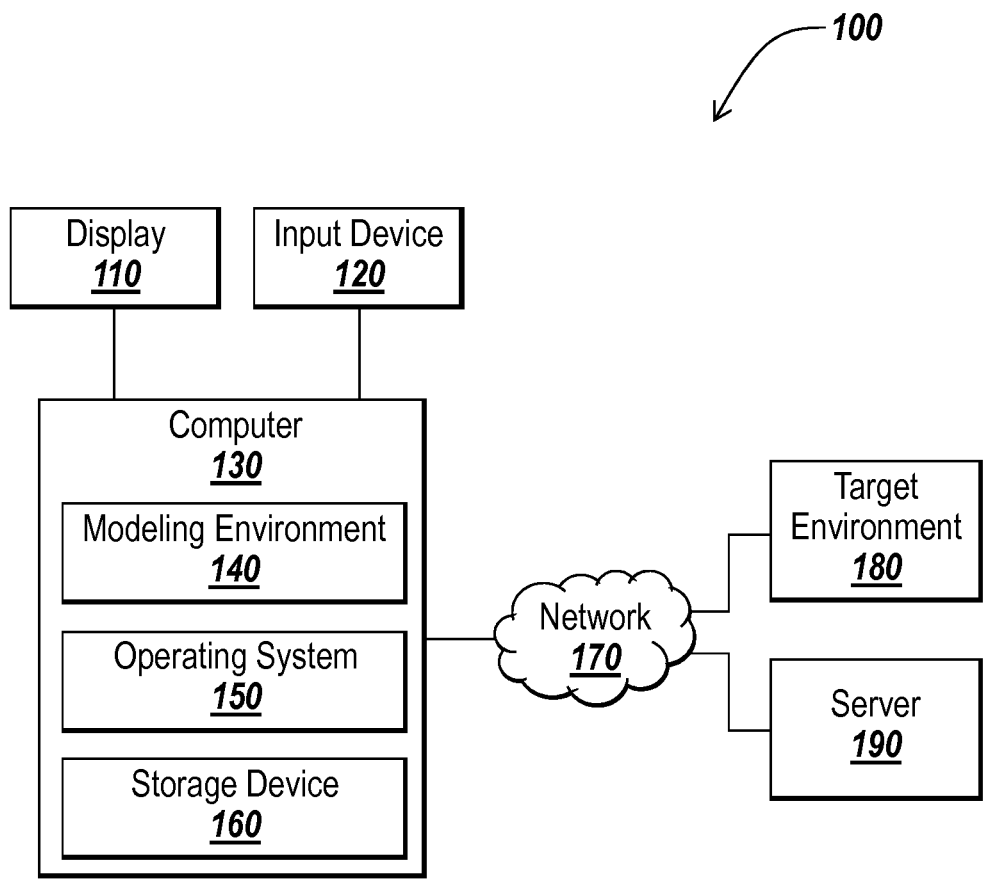
FIG. 1 illustrates an exemplary system for practicing an embodiment.

The following detailed description of implementations consistent with principles of the invention refers to the accompanying drawings. The same reference numbers in different drawings may identify the same or similar elements. Also, the following detailed description does not limit the invention. Instead, the scope of the invention is defined by the appended claims and their equivalents.

Overview

Users may create complex models having hundreds or even thousands of components (e.g., blocks). In some instances, a user may wish to modify one or more blocks in the original model to create a modified model that can be compared to the original model to determine whether the original model or the modified model has more desirable characteristics. For example, a user may use a default function in a block within an original model, where the default function is provided to the user via a vendor or other third party. The user may replace the default function with a user generated function (referred to as a modified function) and may save the modified block and model as a modified model. The user may wish to compare the operation of the default function with the operation of the modified function to determine which one is most desirable for a given application.

In other situations, a user may wish to run an original model on a number of simulation platforms. For example, the user may wish to run the model on a Windows® platform, a Linux platform, a Mac OS® platform, an embedded platform, etc. The user may further wish to compare model results across the various simulation platforms to determine how different platforms affect model operation.

Exemplary embodiments of the invention allow the user to perform model-to-data traceability. For example, embodiments can be used to trace outputs from a model back to a particular block within the model. By way of example, the user may run an original model and a modified model to obtain an original result and a modified result. The user may notice that the modified result is unexpected in terms of its value. The user may use an embodiment of the invention to trace the modified output back through the model to determine which block in the modified model produced an unexpected value. The embodiment may also allow the user to compare outputs of respective blocks in the original model to ones in the modified model to determine whether the respective blocks produce an expected or desired result.

Exemplary embodiments of the invention may also allow a user to perform data-to-model traceability. Using the example above, the user may generate code from the original model and from the modified model. An embodiment may be used to trace back from a code location in the generated code back to a location in a model responsible for producing the code at the code location. The embodiment may also allow the user to compare respective portions of generated code from the original model to corresponding code portions in code generated from the modified model.

Exemplary System

FIG. 1 illustrates an exemplary system 100 for practicing an embodiment. For example, system 100 may be used to construct models that include one or more entities, to execute the models, generate code from the models, perform trace back operations with respect to the models, and/or display trace back information to a user. System 100 may include display 110, input device 120, computer 130, network 170, target environment 180 and server 190. The system in FIG. 1 is illustrative and other embodiments of system 100 can include fewer devices, more devices, and/or devices in configurations that differ from the configuration of FIG. 1.

Display 110 may include a device that displays information to a user. Display 110 may include a cathode ray tube (CRT), plasma display device, light emitting diode (LED) display device, liquid crystal display (LCD) device, etc. Embodiments of display 110 may be configured to receive user inputs (e.g., via a touch sensitive screen) when desired. In an embodiment, display 110 can display one or more graphical user interfaces (GUIs) to a user. The GUIs may display a model, inputs for a model (e.g., user specified objectives, constraints, etc.), model outputs, and/or other types of information to a user.

Input device 120 may include logic to receive input from a user. For example, input device 120 may transform a user motion or action into a signal or message that can be interpreted by computer 130. Input device 120 can include, but is not limited to, keyboards, pointing devices, biometric devices, accelerometers, microphones, cameras, haptic devices, etc. In an embodiment, input device 120 may receive inputs from a user specifying two models along with objectives and constraints to be applied to the models. Display 110 may display results of the models to the user when the models execute.

Computer 130 may include a device that performs processing operations, display operations, communication operations, etc. For example, computer 130 may include logic, such as one or more processing or storage devices, that can be used to perform and/or support processing activities on behalf of a user. Embodiments of computer 130 may include a desktop computer, a laptop computer, a client, a server, a mainframe, a personal digital assistant (PDA), a web-enabled cellular telephone, a smart phone, smart sensor/actuator, or another computation or communication device that executes instructions to perform one or more activities and/or to generate one or more results.

Computer 130 may further perform communication operations by sending data to or receiving data from another device, such as server 190. Data may refer to any type of machine-readable information having substantially any format that may be adapted for use in one or more networks and/or with one or more devices. Data may include digital information or analog information. Data may further be packetized and/or non-packetized.

An embodiment of computer 130 may include modeling environment 140, operating system 150, and storage device 160. Modeling environment 140 may provide a computing environment that allows users to perform simulation or modeling tasks related to disciplines, such as, but not limited to, mathematics, science, engineering, medicine, business, etc. Modeling environment 140 may support one or more applications that execute instructions to allow a user to construct a model having executable semantics. In an embodiment, modeling environment 140 may execute the model to produce a result.

Models used with exemplary embodiments of the invention may include information in a textual or graphical form. For example, a model may be a textual model or graphical model that can be time-based model (e.g., differential equation models, difference equation models or discrete-time models with or without algebraic constraints, etc.), event-based model, state transition model, data flow model, component diagram, entity flow diagram, equation-based language diagram, etc.

Operating system 150 may manage hardware and/or software resources associated with computer 130. For example, operating system 150 may manage tasks associated with receiving user inputs, operating computer 130, allocating memory, prioritizing system requests, etc. In an embodiment, operating system 150 may be a virtual operating system. Embodiments of operating system 150 may include Linux, Mac OS, Microsoft Windows, Solaris, UNIX, etc. Operating system 150 may further run on a virtual machine, which can be provided by computer 130.

Storage device 160 may include a magnetic, solid state and/or optical recording medium and its corresponding drive, or another type of static storage device that may store static information and/or instructions for use by computer 130. Exemplary embodiments of storage device can include random access memory (RAM) or another type of dynamic storage device that may store information and instructions for execution by processing logic operating in computer 130. Storage device 160 may further include read only memory (ROM), and/or other types of static storage.

Network 170 may include any network capable of transferring data (e.g., packet data or non-packet data). Implementations of network 170 may include local area networks (LANs), metropolitan area networks (MANs) and/or wide area networks (WANs), such as the Internet, that may operate using substantially any network protocol, such as Internet protocol (IP), asynchronous transfer mode (ATM), synchronous optical network (SONET), user datagram protocol (UDP), IEEE 802.10, etc.

Network 170 may include network devices, such as routers, switches, firewalls, and/or servers (not shown). Network 170 may be a hardwired network using wired conductors and/or optical fibers and/or may be a wireless network using free-space optical, radio frequency (RF), and/or acoustic transmission paths. In an implementation, network 170 may be a substantially open public network, such as the Internet. In another implementation, network 170 may be a more restricted network, such as a corporate virtual network. Implementations of networks and/or devices operating on networks described herein are not limited to any particular data type, protocol, architecture/configuration, etc. For example, in an embodiment, network 170 may be a quantum network that uses quantum-compatible networking protocols.

Target environment 180 may include logic that executes instructions to perform one or more operations. In an embodiment, target environment 180 can include processing logic adapted to execute code generated from one or more models. In an embodiment, target environment 180 can include real-time logic for performing processing operations in real-time. For example, target environment 180 may include a real-time operating system and hardware that are configured to process received signals or events in real-time or to execute simulations in real-time.

Exemplary embodiment of target environment 180 can include field programmable gate arrays (FPGAs), application specific integrated circuits (ASICs), application specific instruction-set processors (ASIPs), digital signal processors (DSPs), graphics processor units (GPUs), programmable logic devices (PLDs), etc. Target environments 180 can further include a single processor that includes two or more types of logic, such as cores. Target environments 180 can be configured to support multi-threaded or multi-process applications using FPGAs, ASICs, ASIPs, DSPs, GPUs, PLDs, cores, etc.

Server 190 may include a device that receives data from, and sends data to, another device and/or network. For example, server 190 may include one or more server devices/computers (e.g., a workstation, mainframe, desktop computer, laptop computer, PDA, web enabled cellular telephone, smart phone, Wi-Fi device, smart sensor/actuator, or another type of device). Server 190 may be implemented as a standalone device, a distributed arrangement of devices (e.g., a cluster or pool of devices) arranged in substantially any type of configuration (e.g., star, ring, grid, etc.). Distributed implementations of server 190 may further include devices, such as load balancers, schedulers, network devices, etc., to allow distributed implementations of server 190 to operate in a determined manner.

In one implementation, server 190 may provide a service to other devices in system 100, such as computer 130. For example, server 190 may provide remote processing services to computer 130 via network 170.

Exemplary Modeling Environment

Figure 2:
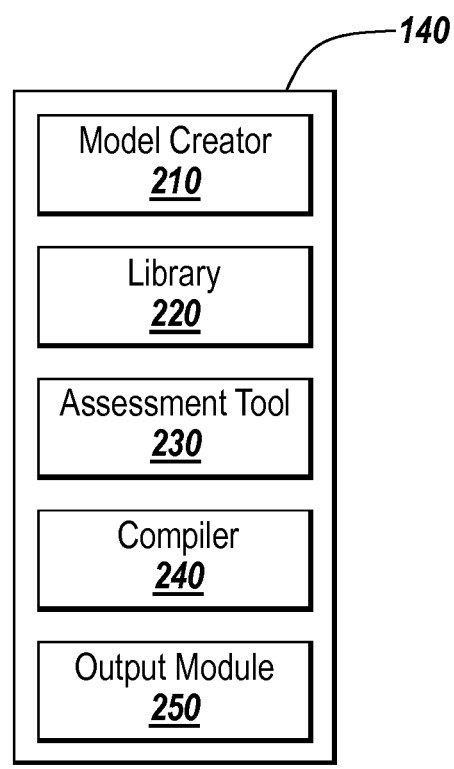
FIG. 2 illustrates an exemplary embodiment of a modeling environment.

FIG. 2 illustrates an exemplary embodiment of a modeling environment 140. Modeling environment 140 can include model creator 210, library 220, assessment tool 230, compiler 240, and output module 250. The embodiment of modeling environment 140 illustrated in FIG. 2 is illustrative and other embodiments of modeling environment 140 can include more entities or fewer components without departing from the spirit of the invention.

Model creator 210 may be an application for building a model. Model creator 210 can be used to build a textual model or a graphical model having executable semantics. In the case of graphical models, model creator 210 may allow users to create, modify, diagnose, delete, etc., model entities and/or connections. For example, model creator 210 may display a canvas onto which a user can place blocks, connections, etc., for creating a model of a dynamic system. Model creator 210 may interact with other entities illustrated in FIG. 1 or 2 for receiving user inputs, executing a model, displaying results, generating code, etc.

Library 220 may include code modules or entities, e.g., blocks/icons, and/or connections (e.g., lines) that a user can drag and drop onto a canvas that includes a model. In the case of graphical models, a user may further couple entities obtained from the library using connections to produce a graphical model of a system.

Assessment tool 230 may allow a user to perform model-to-data verification and/or data-to-model verification. In an embodiment, assessment tool 230 may include code for receiving user inputs specifying criteria for use in verifying one model with respect to another model. Assessment tool 230 may further allow a user to weight criteria according to the relative importance of criteria to the user. Assessment tool 230 may create objective functions and/or constraints using the criteria and may use the objective functions for creating a measurement space over which a model is evaluated. Information for the measurement space may be stored in a data structure created on behalf of assessment tool 230.

In an embodiment, assessment tool 230 may populate components in a model with output ports and may store signal values for the ports for use in performing trace back operations on the model. The trace back operations may identify a location in the model responsible for producing an output value outside a determined range, such as a range indicating acceptable output values.

Compiler 240 may compile a model into an executable format. Compiled code produced by compiler 240 may be executed on computer 130 to produce a modeling result. In an embodiment, compiler 240 may also provide a user with debugging capabilities for diagnosing errors associated with the model and profiling capabilities for analyzing performance characteristics. Embodiments of compiler 240 may interact with assessment tool 230 to, for example, allow assessment tool 230 to store information related to compiler switch settings used to compile a model.

Output module 250 may include code for generating one or more outputs from a model when the model is executed. For example, output module 250 may display a model, a modeling result, input criteria, objectives, objective functions, constraints, etc., to a user via display 110. In an embodiment, output module 250 may create a graphical user interface (GUI) for displaying information to a user. Output module 250 may further produce other types of output from a model, such as generated code. In an embodiment, generated code can be configured for execution in target environment 180, which may be, for example, an embedded system.

Exemplary Model

Figure 3A:
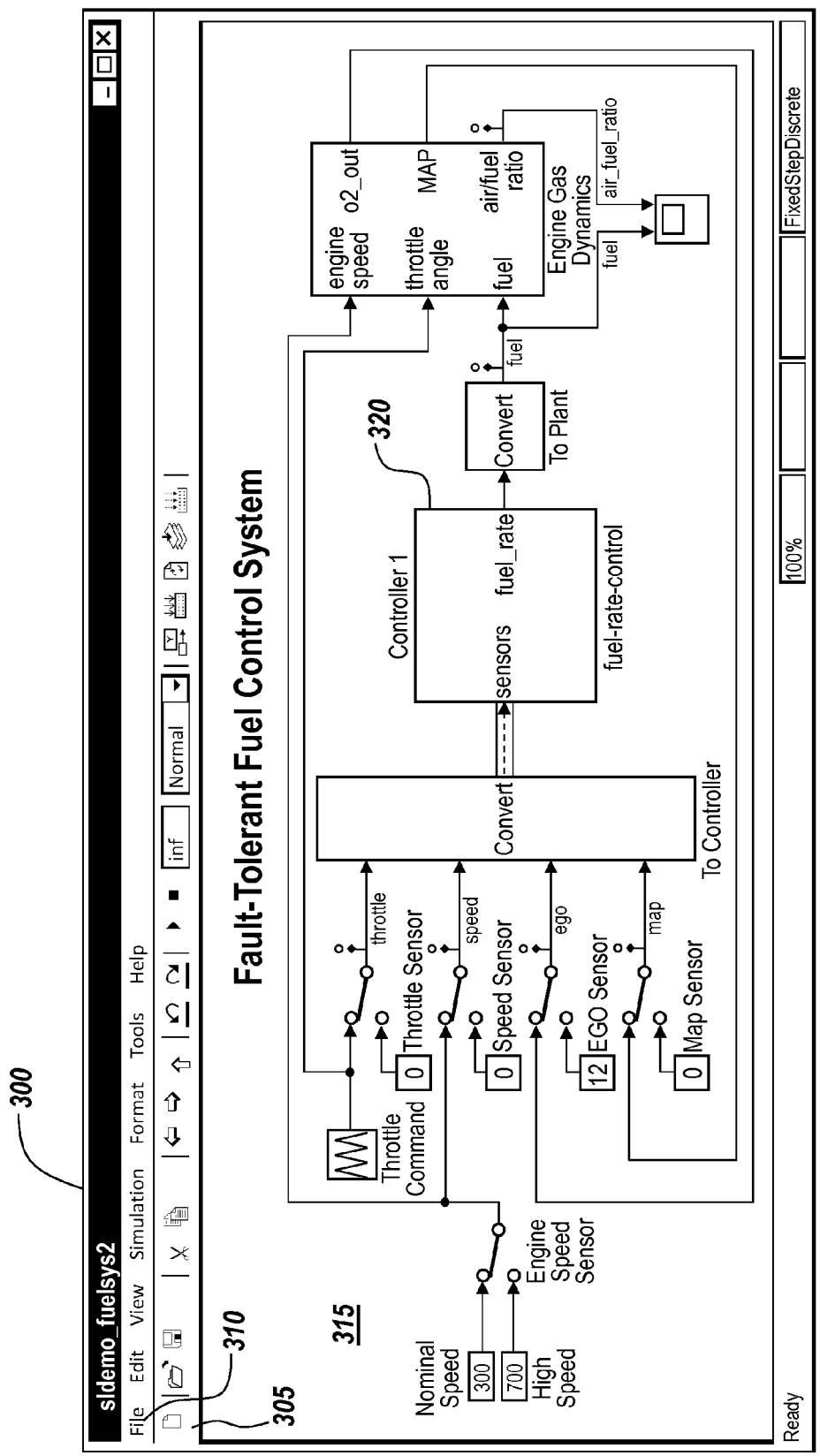
FIG. 3A illustrates an exemplary model that includes a first variant of a controller.

FIG. 3A illustrates an exemplary model that can represent a controlled system. In FIG. 3A, the controlled system is a fault tolerant fuel control system. FIG. 3A can include model window 300, drop down menus 305, control icons 310, and canvas 315. Model window 300 may be a user interface for displaying one or more graphical models to a user. Window 300 may include model components, such as block 320, and/or signals connecting blocks. In window 300 signals may be represented as solid lines.

Drop down menus 305 may provide a user with access to commonly used commands that can be applied to a model. For example, a File drop down menu may allow a user to select a Save, Open, Save As, Print Preview, etc., command. Control icons 310 may provide a user with graphical icons that represent commonly used commands. For example, icons may represent a File Open, Print, Save As, Copy, etc. command. Canvas 315 may represent a display region on which a user can create a model. In an embodiment, canvas may include graphical representations in library 220. The graphical representations may be moved from library 220 onto another region of canvas 315 and connected together via signals to create a model.

The model of FIG. 3A may include one or more components (e.g., blocks) that perform an operation when a model is executed. For example, a block may include an algorithm and the algorithm may be executed when a model including the block is run. In FIG. 3A, block 320 may represent a fuel rate controller that can be identified as "controller 1" in the model. In an embodiment, block 320 may include one or more default algorithms that perform fuel rate control operations when block 320 is executed. Block 320 may represent a first variant of a fuel rate controller, such as a variant provided by a vendor that manufactures a fuel rate controller for use in an automobile. The first variant may include algorithms provided by the vendor, where the algorithms are designed to provide acceptable performance in a number of automobile types.

The model of FIG. 3A may be executed using the first variant of block 320, and the executed model may produce a result. For example, the model may produce a waveform representing amplitude versus time. The magnitude of amplitude may indicate the degree with which the first variant of block 320 can control fuel rate in a particular automobile.

Figure 3B:
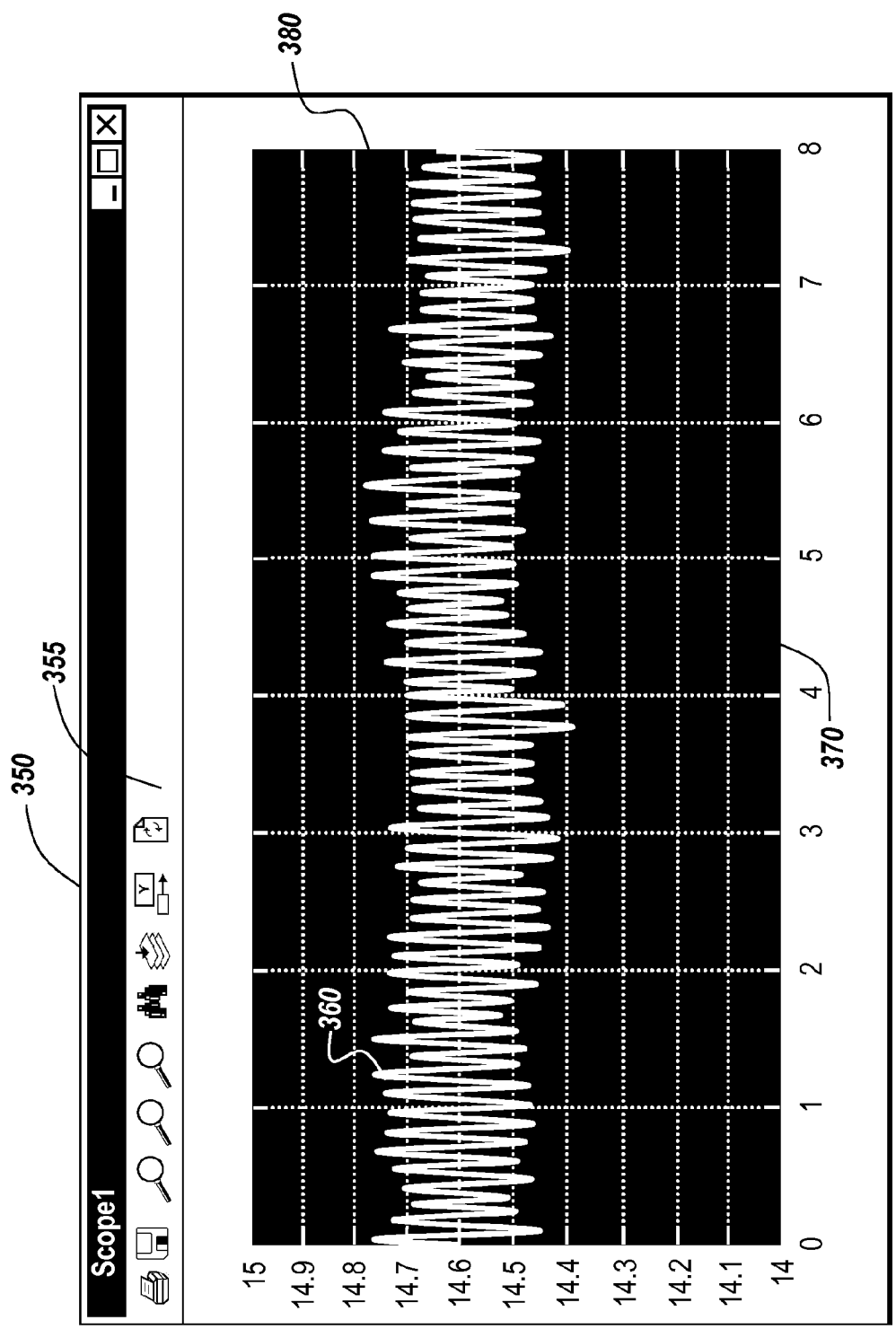
FIG. 3B illustrates an exemplary output for the model of FIG. 3A.

Referring to FIG. 3B, window 350 includes trace 360 that may represent the output of the model of FIG. 3A or of a component in the model, such as block 320. Window 350 may include icons 355 for providing a user with one-click access to commonly used functions that can be applied to trace 360. Window 350 may further include an x-axis 370 and a y-axis 380 that can each include a scale.

Figure 4A:
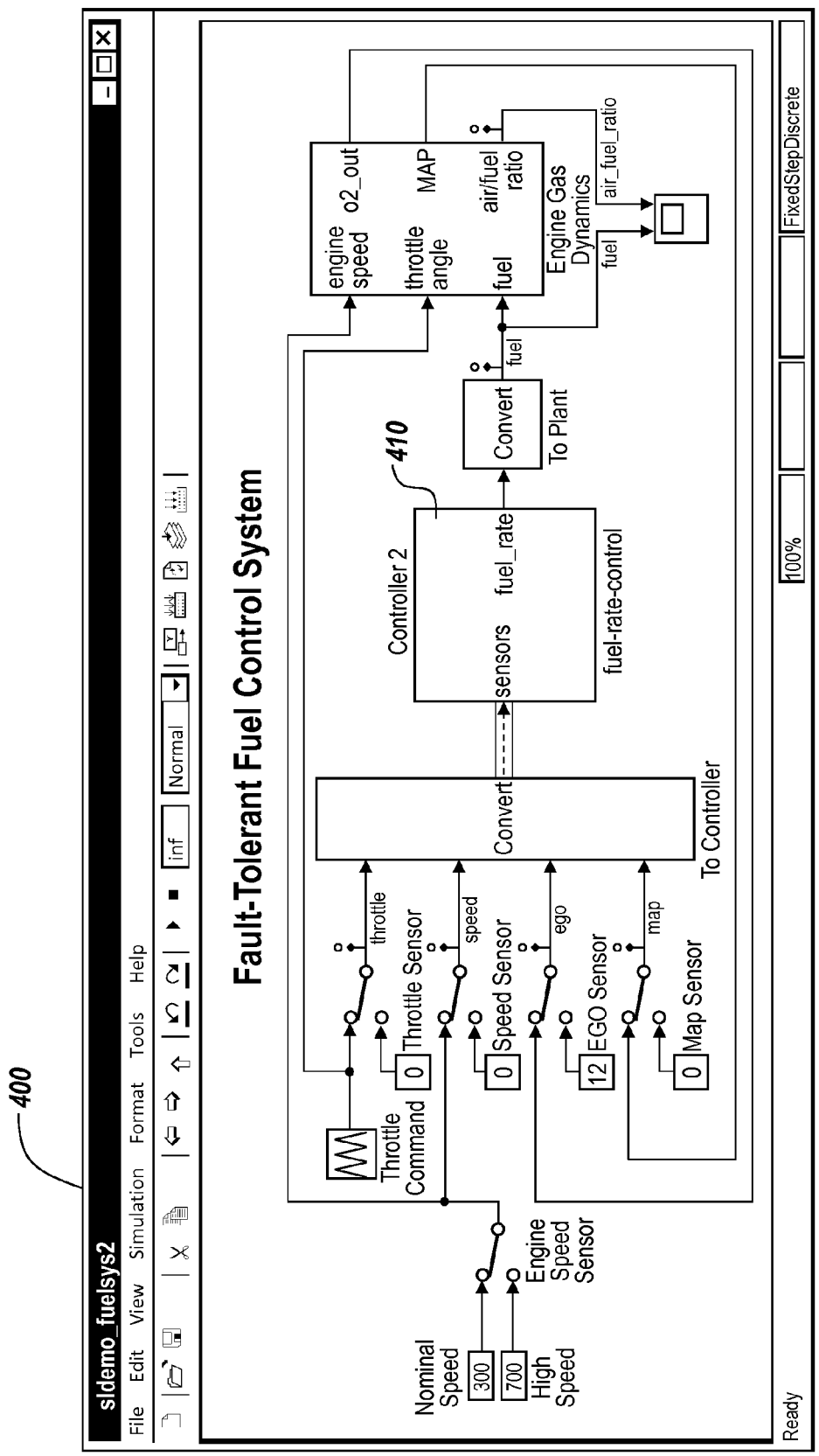
FIG. 4A illustrates an exemplary model that includes a second variant of a controller.

FIG. 4A illustrates a model that includes a second variant of a fuel rate controller for use with an automobile. Model window 400 may include a model containing block 410 that represents the second variant of a fuel rate controller. For example, block 410 may include one or more user developed algorithms for performing fuel rate control operations in the model when the model is executed. The user developed algorithms may represent a modified version of the fuel rate controller, whereas the first variant illustrated in FIG. 3A may represent a default version of the fuel rate controller received from the vendor.

Figure 4B:
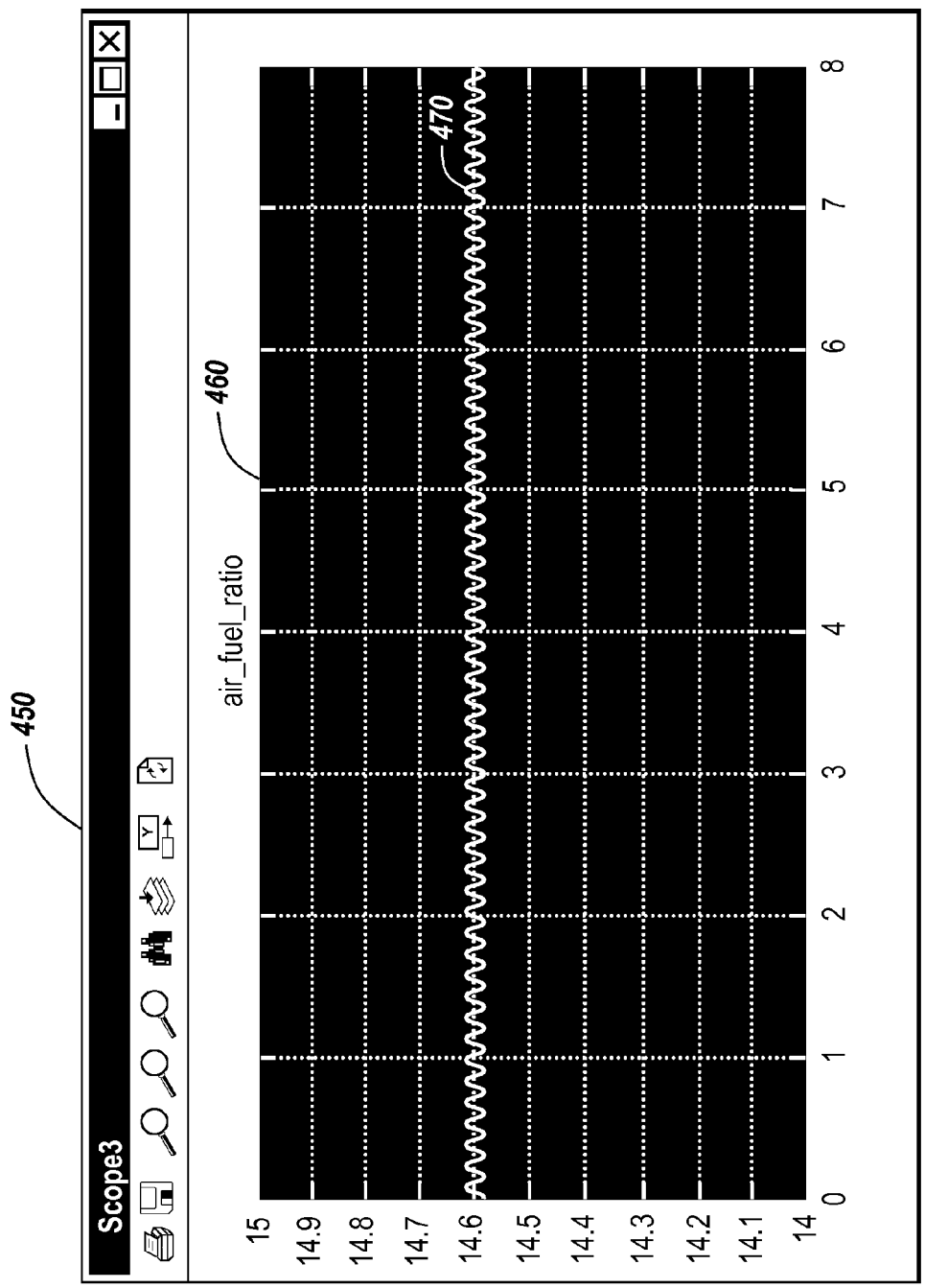
FIG. 4B illustrates an exemplary output for the model of FIG. 4A.

The second variant of the fuel rate controller may produce an output illustrated in FIG. 4B when the model of FIG. 4A is executed. Window 450 may include features similar to those found in FIG. 3B. Window 450 may further include a label 460 that identifies trace 470, which may represent the output of block 410 and/or the entire model of FIG. 4A. As can be seen by comparing trace 360 and trace 470, the amplitude of trace 470 is smaller than the amplitude of trace 360. The amplitude of trace 470 may indicate that the modified version of the controller represented via block 410 does a better job of providing fuel rate control to the automobile as compared to the default fuel rate controller of FIG. 3A.

Visual inspection of FIGS. 3B and 4B may, in some instances, be used to determine which fuel rate controller variant performs better. However, in other instances user specified objectives and/or constraints may be used to iden-tify how well a component or an entire model performs. For example, a user may provide criteria against which controller performance can be evaluated. A user may indicate that a controller should respond within a certain time interval, that the minimum and maximum output values should be within a determined range, that the controller should not use more than a determined amount of memory, etc.

A user may further place varying degrees of importance on the criteria when the model is executed. For example, the user may indicate that a memory footprint for the controller is the most important criteria and that response time for the controller is of lesser importance criteria. Exemplary embodiments of the invention allow the user to enter criteria for objectives and/or constraints and to provide information indicating the relative importance of criteria with respect to each other, e.g., the user can indicate a weighting for entered criteria.

The user entered criteria and the criteria weighting information can be used to produce objective functions which are evaluated subject to constraints. Embodiments of the invention can evaluate designs using the objective functions and constraints and can indicate whether one design performs in a more desirable manner than another design. Embodiments may display information about the designs to a user via a GUI or other display technique, e.g., at textual window.

Exemplary Technique

In an embodiment of the invention, an analysis and design problem can be stated as a constraint multi-objective optimization problem. Objectives and/or constraints can be provided using criteria, such as, but not limited to:
an accuracy goal,
a speed goal,
a memory footprint goal,
a parameter for generated code,
a specification for an output,
a specification for a message string,
a size goal,
a cost goal,
a power consumption goal,
a working frequency range,
a response parameter indicating a time interval for an error message,
a correctness goal for a programming language associated with the model,
a robustness parameter, and/or
a compiler switch.

Some of the criteria may be considered objectives, which the embodiment may attempt to maximize or minimize when a model is executed. In contrast, other of the criteria may be considered hard constraints or soft constraints for use in the optimization problem. By way of example, a user may specify that it is preferable to have a smaller (e.g., minimize memory footprint size) and faster (maximize computational speed) design that does not exceed a specified working frequency (i.e., a hard constraint).

A multi-objective minimization problem that can be used with exemplary embodiments can be formulated through a set of objectives subject to a number of constraints. For example, the objectives can be represented as:

$F_i(x)$, i=1, 2, . . . , subject to a number of constraints or bounds:

$$\min_{x \in \mathfrak{R}^n} F(x), \text{ subject to } G_i(x) = 0, i = 1, \ldots, k_e; \quad \text{(Eq. 1)}$$

-continued $$G_i(x) \leq 0, i = k_e + 1, \ldots, k; l \leq x \leq u.$$

with: $F(x)=[F_1(x),F_2(x), \ldots ,F_m(x)]$. (Eq. 2)

In an exemplary embodiment, components of F(x) can compete for the optimal solution, which may inhibit or prevent the uniqueness of the optimal solution. When this occurs, a concept of a non-inferior solution may be used. For example, in the non-inferior solution case an improvement in one objective may result in, or may require, a degradation of another objective. An example of a non-inferior solution that can be used in exemplary embodiments of the invention is Pareto optimality.

By way of example, given a feasible region, $\Omega$ in a parameter space. Let x be an element of the n-dimensional real space that satisfies all the constraints and can be written as:

$$\Omega = \{x \in \Re^n\}, \quad \text{(Eq. 3)}$$

and subject to:

$$G_i(x)=0, i=1, \ldots, k_e,$$

$$G_i(x) \leq 0, i=k_e+1, \ldots, k,$$

$$l \leq x \leq u. \quad \text{(Eq. 3 and Eq. 4)}$$

Using the above, a feasible region for the objective function space $\Lambda$ can be defined as:

$$\Lambda = \{y \in \Re^m : y = F(x), x \in \Omega\}. \quad \text{(Eq. 5)}$$

A user may wish to learn about the set of optimal solutions (e.g., the Pareto set) to reduce the size of a design space in a set of optimal trade-offs. In an exemplary embodiment, one or more genetic algorithms may be used to solve the optimization problem. Genetic algorithms may be useful for solving types of optimization problems encountered by the user because genetic algorithms may adequately handle working with multiple conflicting objectives and intractably large and highly complex search spaces by approximating the Pareto set. Other processing techniques that may be used with exemplary embodiments having conflicting objectives and/or large/complex search spaces are, but are not limited to, evolutionary programming, and evolution strategies. In an embodiment of the invention, the genetic algorithm gamultobj from the Genetic Algorithm and Direct Search Toolbox™ (The MathWorks Inc., of Natick, Mass.) may be used to solve an optimization problem related to an exemplary embodiment of the invention.

Figure 5:
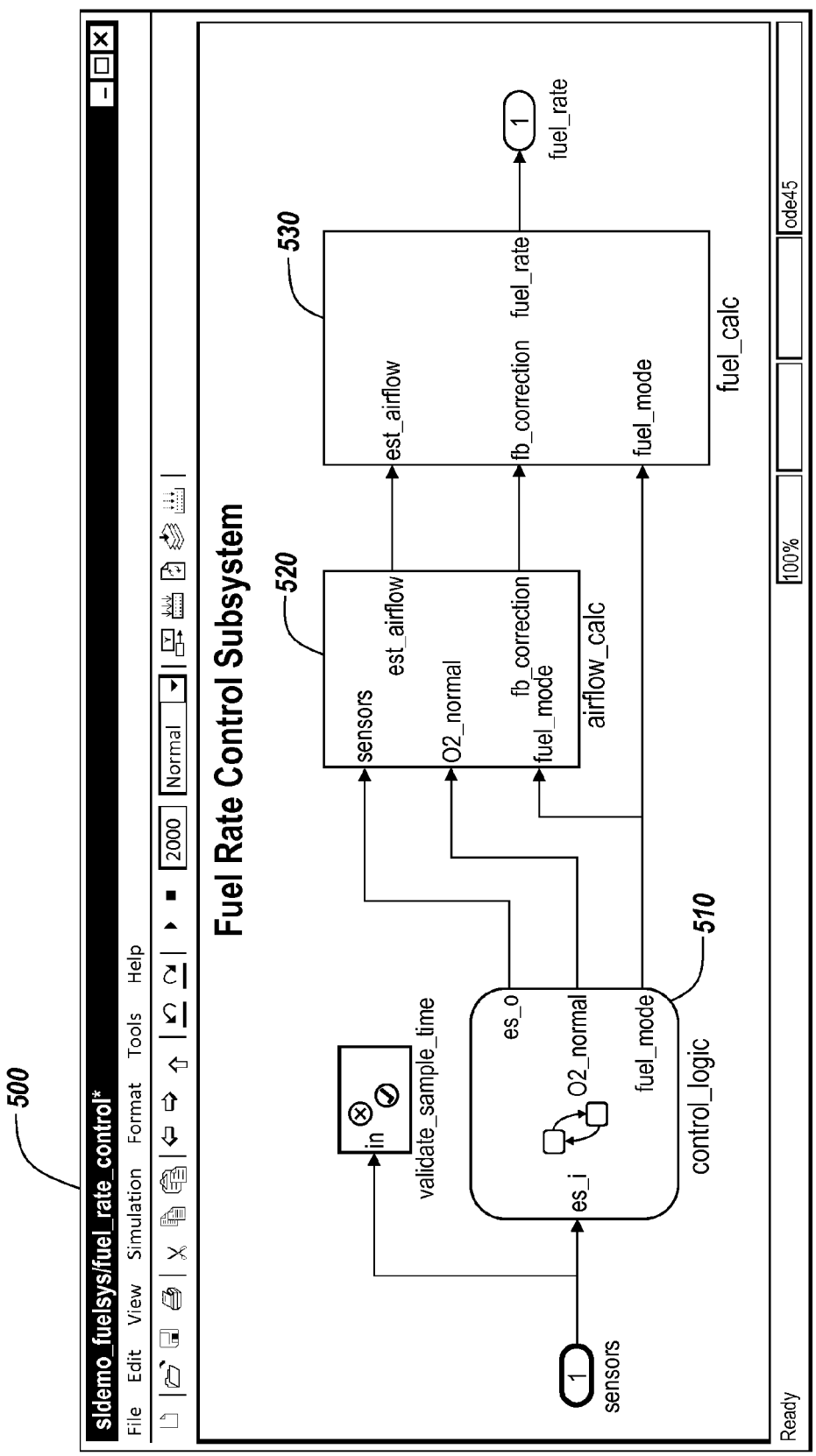
FIG. 5 illustrates an exemplary model that includes control logic for a controller.

FIG. 5 illustrates an exemplary model that can be used to implement the fuel rate controllers of FIG. 3A and FIG. 4A. In FIG. 5, the controllers can respectively be implemented via a subsystem that can have two different designs. In FIG. 5, the controllers are represented as the subsystem labeled control_logic and identified via block 510. In an embodiment, the fuel rate controller system model can be displayed in model window 500. Block 510 may, for example, represent a default controller provided by a software or hardware vendor in a first model, and block 510 may represent a modified controller that includes user generated control algorithms in a second model.

With respect to FIG. 5, assume the user specifies optimization objectives to be maximizing accuracy and speed while minimizing controller size and controller cost. In the example, the objectives are competing objectives because better accuracy, in the example, requires more analysis on the inputs than would be required if less accuracy was desired. For example, more if-the statements may be needed for a high accuracy solution as compared to a low accuracy solution. Better accuracy may further result in reduced throughput for the controller and may further increase implementation costs and/or implementation size (e.g., memory footprint).

For example, in target environments 180, compilers, and data types can play a an important role in a final implementation for a controller. For example, a target environment using single-precision arithmetic with single instruction, multiple data (SIMD) optimization can perform 4 multiplications with one instruction. However, the same target environment using double-precision arithmetic with SIMD optimization can only perform 2 multiplications per instructions. Moreover, the same target environment without SIMD optimization enabled can perform only one multiplication per instruction.

Continuing with the example, let $F_1(x)$, $F_2(x)$, and $F_3(x)$ denote (user-defined) measures of normalized accuracy, speed, controller size and controller cost, where x is a space of measurements. The measurement space x for the example is formed using the different controller variants, two in this example, expanded by different data types and compiler optimization flags. For purposes of the example, the following data types are used: single, double, and sfix32en28, and compiler optimizations: SIMD enabled or disabled.

Figure 6:
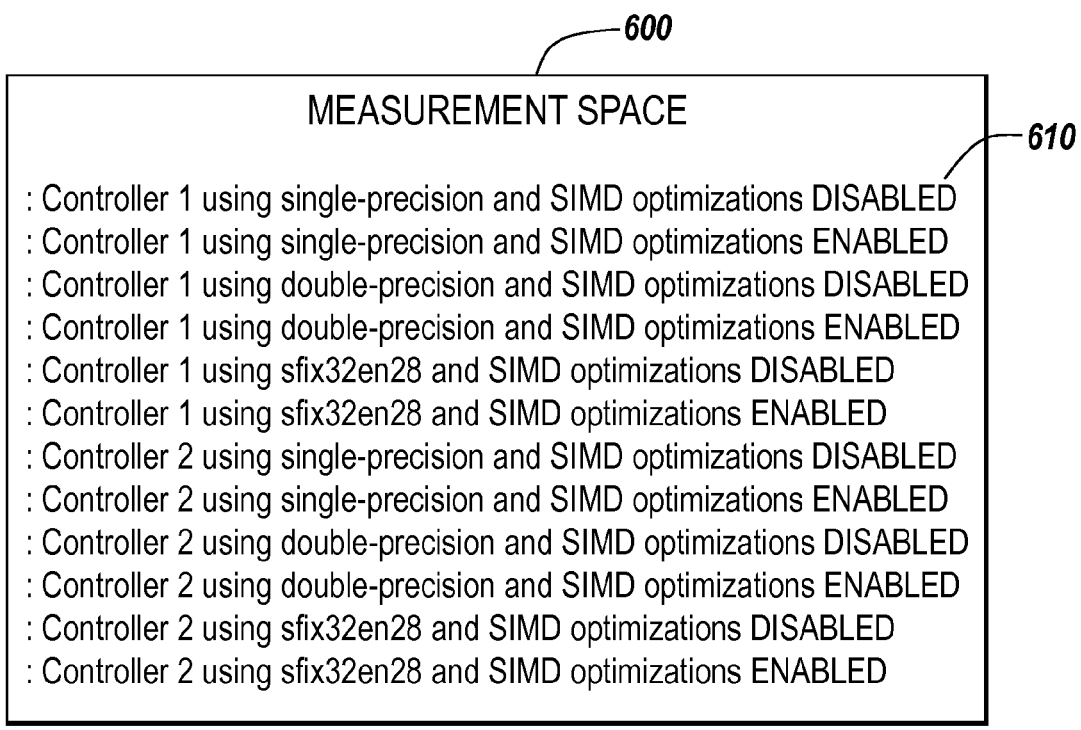
FIG. 6 illustrates an exemplary data structure that includes measurement space information.

FIG. 6 illustrates a data structure 600 that includes information making up measurement space x for the example. Measurement space 610 may be stored in data structure 600 using a variety of techniques known in the art. Information making up measurement space 610 may include a controller identifier, e.g., controller 1 or controller 2, a data type precision identifier (e.g., single-precision, double-precision, sfix32en28, etc.), an optimization identifier (e.g., SIMD enabled, SIMD disabled), and/or other information useful to solving a given optimization problem. As seen from FIG. 6, a measurement space can become very large and/or complex when even a small number of variants are present.

Still continuing with the example, let hard constraints be given by the function $$G_1(x) = \text{fuel} - f_{max} \leq 0, \quad \text{(Eq. 6)}$$

where Eq. 6 indicates that the fuel fed to the plant cannot exceed $f_{max}$.

As can be seen in this example, the number of cases under analysis grows exponentially when things, such as target, compiler, data types, model variants, etc., are accounted for, thus making manual comparison impractical.

The exemplary embodiment of the example includes a decision-making tool that employs an algorithm to help a user select and define acceptable or unacceptable behaviors according to any or all design criteria and/or sets of training patterns available to the user. In an embodiment, acceptable and unacceptable behaviors may define an acceptability range for a given design. The embodiment may allow the user to interactively modify the relative importance of each design criterion in the optimization problem with respect to other design criteria. The embodiment may further allow the user to visualize shapes of objective functions, Pareto frontiers, set of initial conditions, etc., associated with the design. In an embodiment, the shapes of objective functions can be provide to a user via contours. In other embodiments, other shapes can be used to provide shape information to a user.

Exemplary embodiments allow the user to evaluate one design against another and to identify discrepancies between the results of the evaluated designs. Embodiments further allow the user to efficiently and quickly detect discrepancies and to identify sources of the discrepancies (e.g., a component in a model that generates an erroneous or unexpected result). An embodiment of the invention can be configured to perform trace back operations on a model to determine the source of a discrepancy. The trace back technique can identify discrepancies that propagate through a model and can allow for output port level resolution in terms of identifying discrepancies in a model.

Exemplary embodiments can be configured to compare, benchmark, and analyze different algorithms for matrix multiplication. For example, basic linear algebra subprograms (BLAS) against naïve results obtained on different platforms can be performed. Embodiments can compare, benchmark, and analyze desktop implementations and embedded implementations by comparing default components against customer-specific implementations of the components. Embodiments may further be configured to provide a user with an indication of a best design option according to user-defined criteria.

Exemplary embodiments can produce results using a variety of techniques, such as but not limited to, simulation, software-in-the-loop (SIL), processor-in-the-loop (PIL), databases, etc. Exemplary embodiments can allow the user to provide inputs, e.g., criteria, on one platform and to obtain results from the user's platform or from another platform, such as target environment 180.

Figure 7:
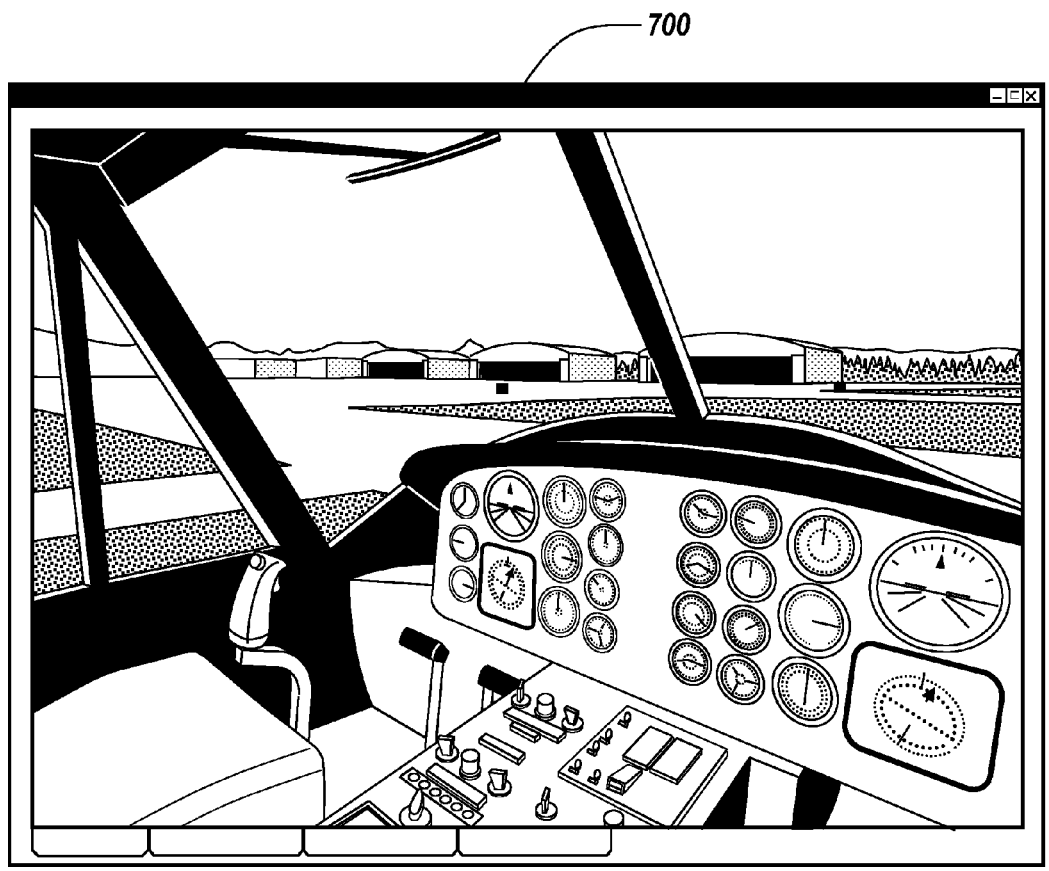
FIG. 7 illustrates an exemplary display showing a cockpit simulator that can be used with an exemplary embodiment of the invention.

For example, a user may be working with a three dimensional model of an aircraft cockpit as illustrated in FIG. 7. The cockpit model 700 may allow the user to simulate pilot inputs, e.g., throttle position, landing gear settings, etc., and aircraft responses to those inputs, such as thrust increases, alarms, etc. For example, a user can provide a series of inputs that indicate what the user expects to happen after a certain transition, e.g., a warning message thrown after a pilot makes a certain movement in the cockpit. An exemplary embodiment may accept the user-defined description as baseline criteria and may report performance of one or more models representing the cockpit according to the user-defined design criteria. The exemplary embodiment may further allow the user to weight criteria with respect to each other and may use the weighting when performing modeling activities and reporting modeling results to the user.

The exemplary embodiment allows the user to evaluate components in cockpit model 700 according to the design criteria. For example, cockpit model 700 may be associated with a block diagram model that includes blocks that implement functionality of the cockpit, such as a cockpit for an F-14 fighter aircraft.

Figure 8:
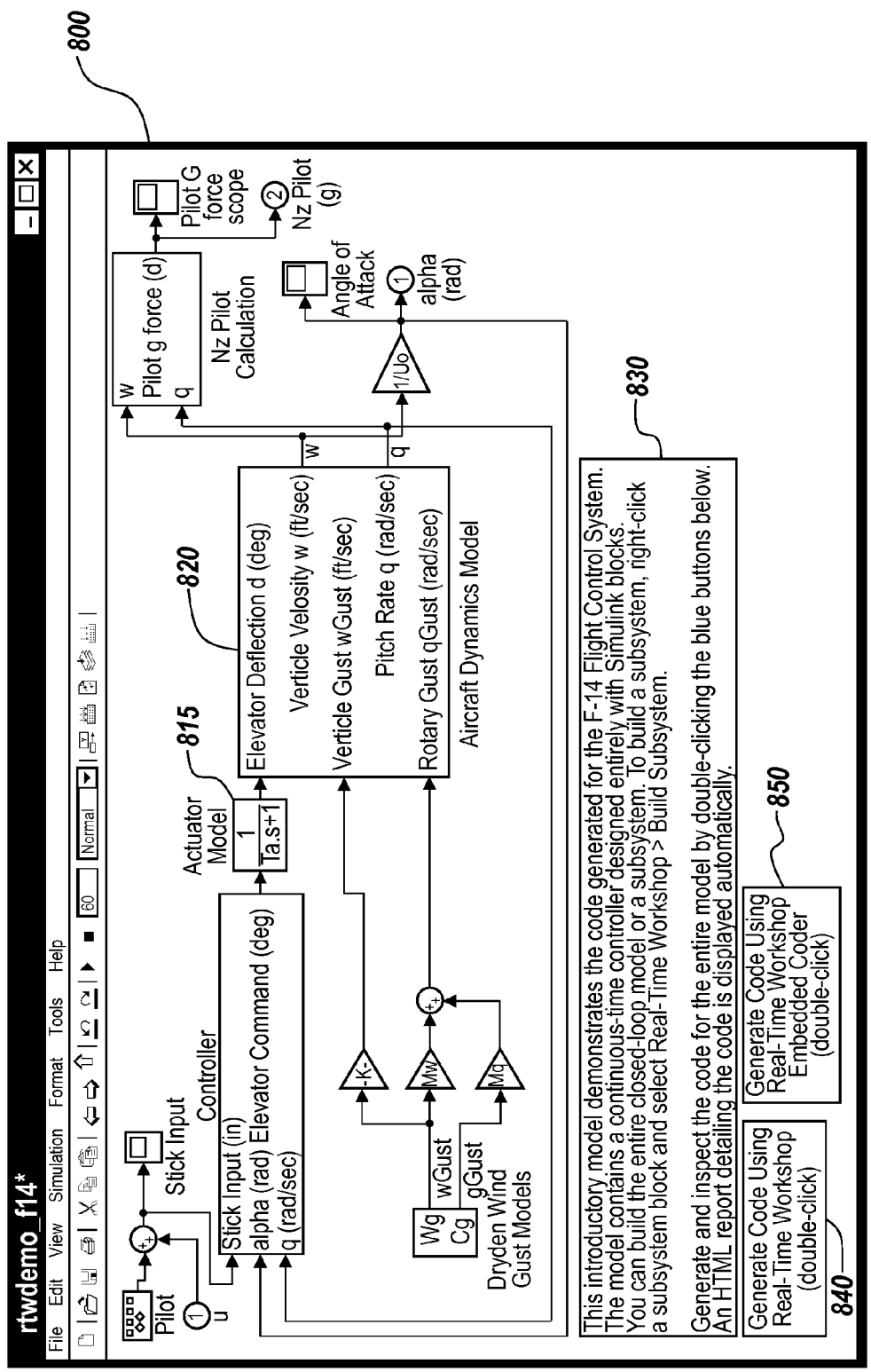
FIG. 8 illustrates an exemplary model that can be used with the simulator of FIG. 7.

FIG. 8 illustrates model window 800 that can include a block diagram model for an aircraft cockpit. The model may include a plurality of blocks and can include an actuator model block 815 and an aircraft dynamics block 820. Actuator block 815 may include one or more algorithms that represent the functionality of an actuator used in an aircraft. Dynamics model 820 may include algorithms that represent the functionality of how the aircraft responds to certain conditions, such as vertical gusts, rotary gusts, etc.

Model window 800 may further include dialog box 830 that provides a user with information about a model, such as a description of what the model represents, the type of model (continuous, discrete, event, etc.), type of control used (open-loop or closed-loop), whether code is generated from the model, etc. Model window 800 may still further include first button 840 and second button 850. First button 840 may provide a user interface for allow a user to select a technique for generating code from a model. For example, first button 840 may allow a user to double click to generate code from a model using a first application, such as Real-Time Workshop provided by The MathWorks Inc. of Natick, Mass. Second button 850 may allow the user to double click to generate code from the model using a second application, such as Real-time Workshop Embedded Coder by The MathWorks Inc. Exemplary embodiments may provide the user with reports detailing a model and/or code generated from the model.

A user may wish to examine how components in a model operate when the model executes. For example, the user may have a first representation of blocks 815 and 820 in a first model of the aircraft (e.g., default versions of blocks 815 and 820) and may have a second representation of blocks 815 and 820 in a second model of the aircraft (e.g., user modified versions of blocks 815 and 820). The user may execute the first and second models and may compare output results for blocks 815 and 820 in the models to determine whether the default version or the user modified version of a block performs better for a given application.

Figure 9:
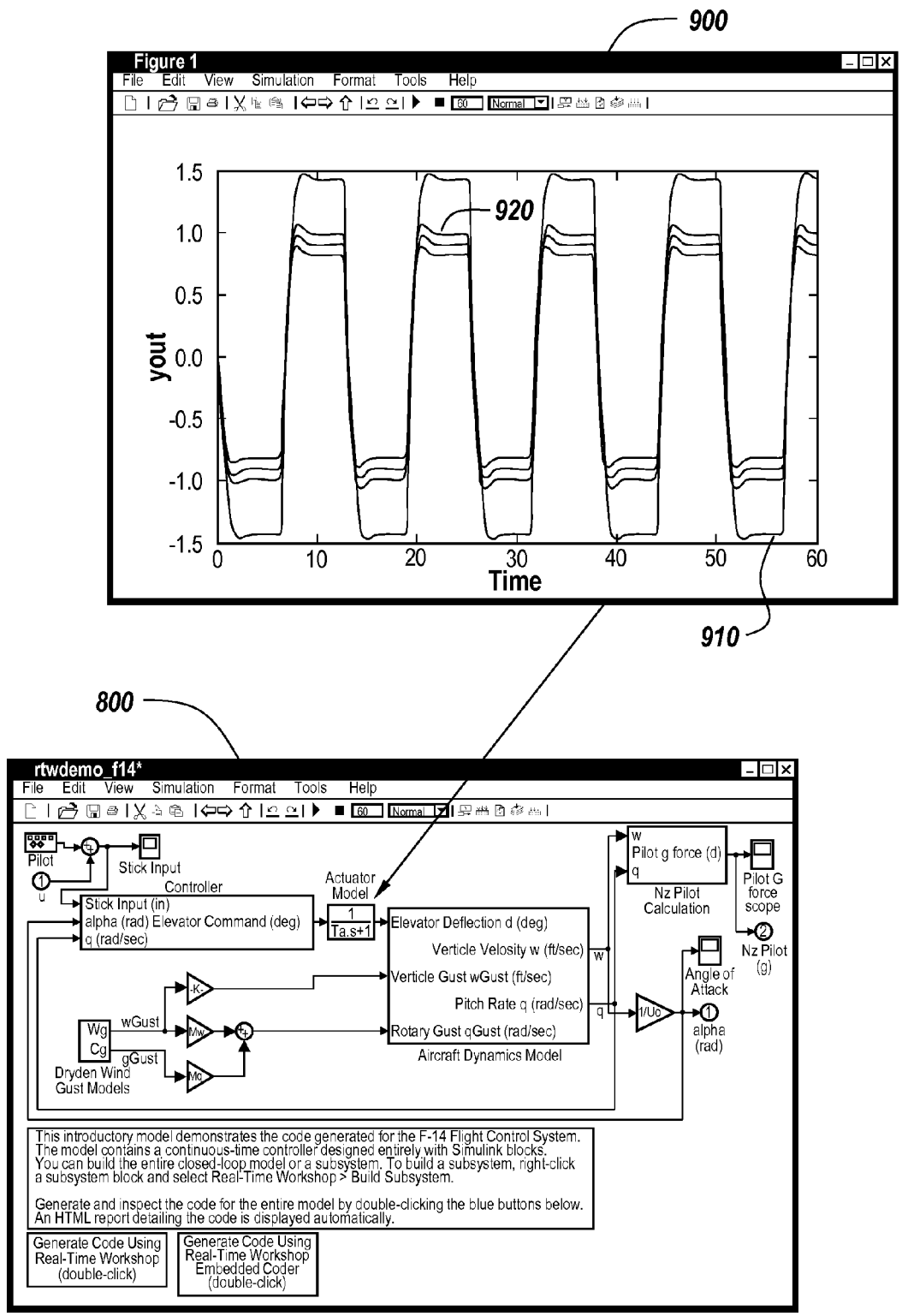
FIG. 9 illustrates an exemplary trace showing the output from a component in the model of FIG. 8.

FIG. 9 illustrates an exemplary output display for a block in the model of FIG. 8. The user may have executed models containing a default versions and user modified versions of blocks 815 and 820 to obtain results for the respective models. The user may wish to examine how the different versions of block 815 operated when the models were executed. The user may open a display window 900 that includes traces identifying how the default version and user modified version of block 815 performed.

For example, trace 910 may indicate how the default version of block 815 performed and trace 920 may indicate how the user modified version of block 815 performed. Display window 900 may also include other traces that can indicate how, for example, a base line version of block 815 operates, how an older revision of block 815 operates, how other user modified versions of block 815 operate, etc. Embodiment of display window 900 can include legends or other indication techniques (color, line thickness, line composition, etc.) for allowing a user to easily identify which trace is associated with a particular version of block 815.

Figure 10:
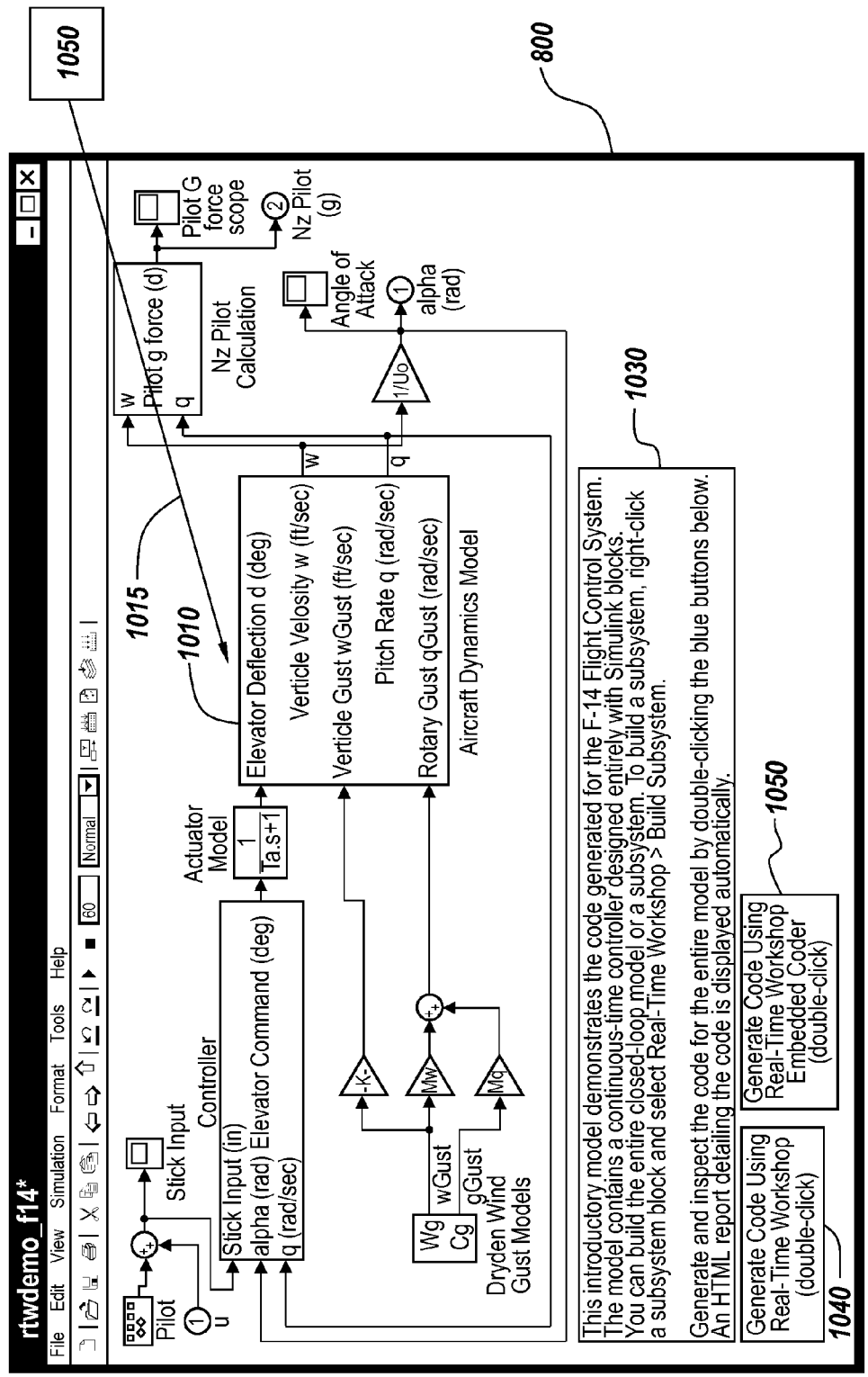
FIG. 10 illustrates an exemplary model that can be used with the simulator of FIG. 7.

FIG. 10 illustrates model window 800 and block 820. In FIG. 10, information associated with versions of block 820 is displayed to a user via display window 1050. An embodiment can include indicator 1015 to inform a user that information displayed in window 1050 is associated with a particular block in one or more models.

Figure 11:
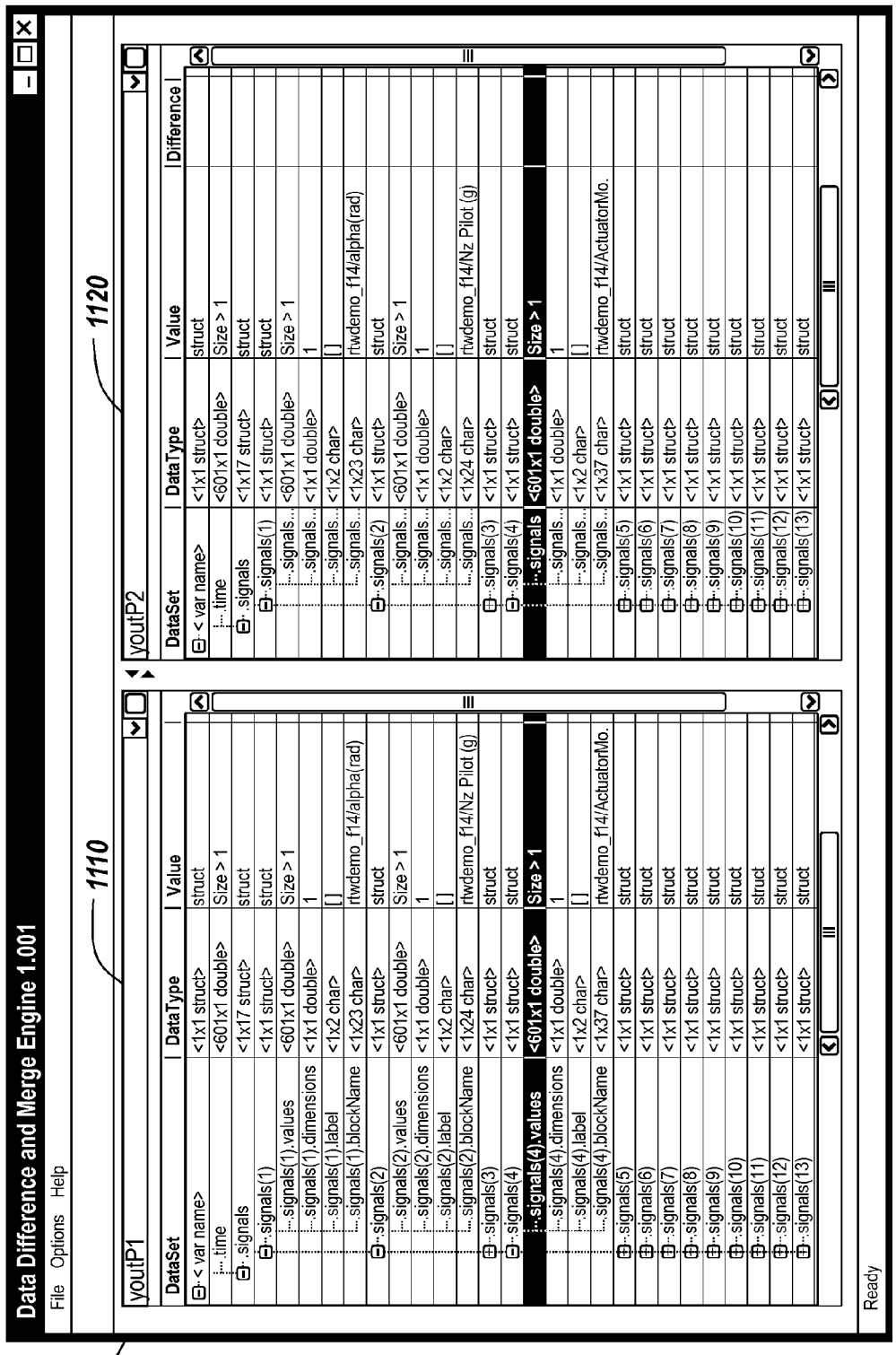
FIG. 11 illustrates an exemplary user interface for displaying signal information related to a component in the model of FIG. 10.

FIG. 11 illustrates the contents of an exemplary implementation of window 1050. Window 1050 may include a first region 1110 for displaying information related to a first variant of block 820, and a second region 1120 for displaying information for a second variant of block 820. Regions 1110 and 1120 may contain fields for displaying information about signals input to or generated by block 820, data types associated with the signals, and values associated with the signals. Other embodiments of window 1050 can include other types of information without departing from the spirit of the invention, such as error information, processing time information, memory footprint information, etc.

Figure 12:
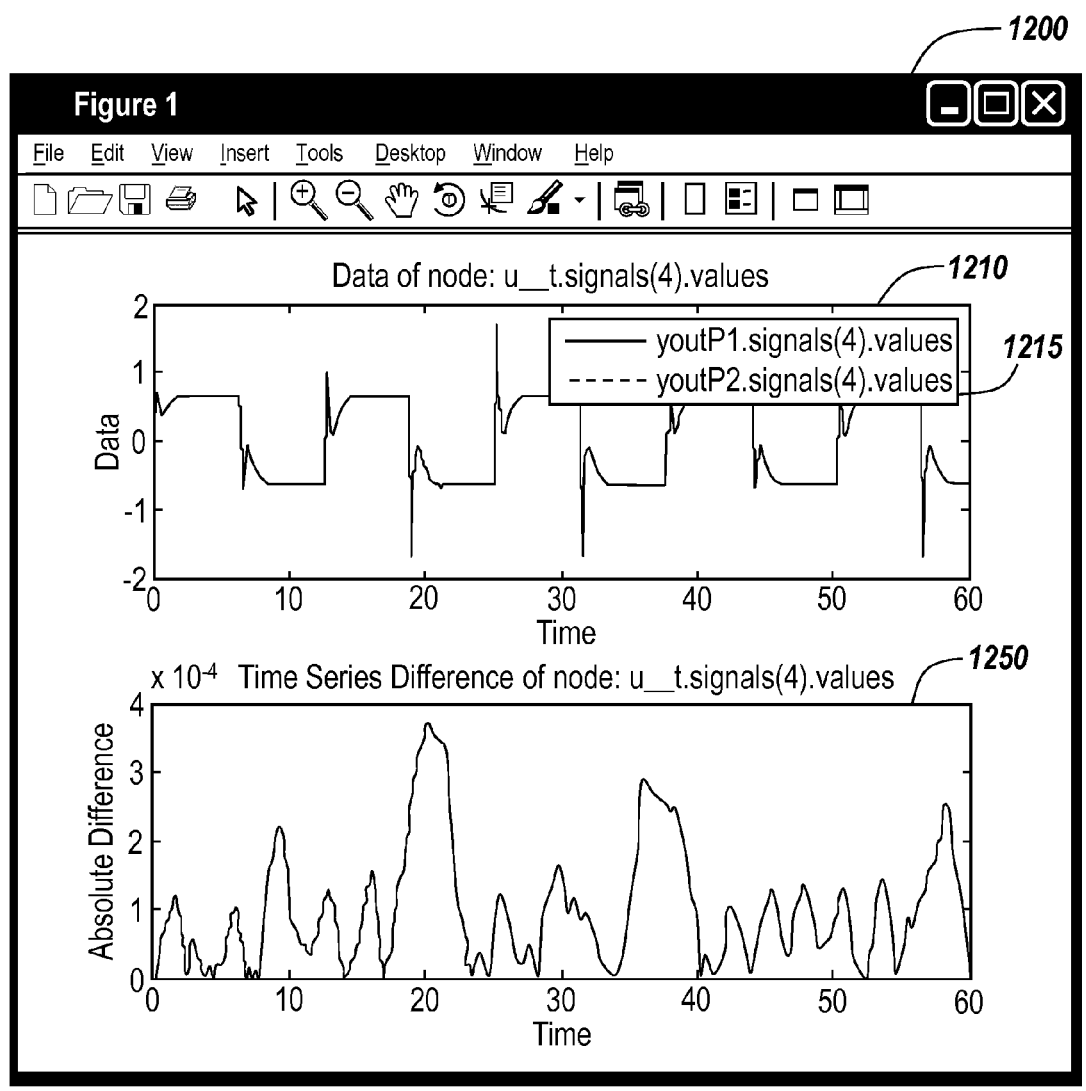
FIG. 12 illustrates an exemplary window for displaying output information for a model.

FIG. 12 illustrates display window 1200 that can include plot regions 1210 and 1250. Plot region 1210 may display traces that indicate how data signals for respective variants of block 820 varied over time. Plot region 1210 may display two traces as indicated by legend 1215. In FIG. 12, the traces may be substantially identical such that one trace overlays the other trace in plot region 1210. Plot region 1250 may display one or more traces indicating an absolute difference between the signals displayed in plot region 1210. Plot region 1250 may aid a user in determining subtle differences between traces for versions of a block.

Exemplary Processing

Figure 13A:
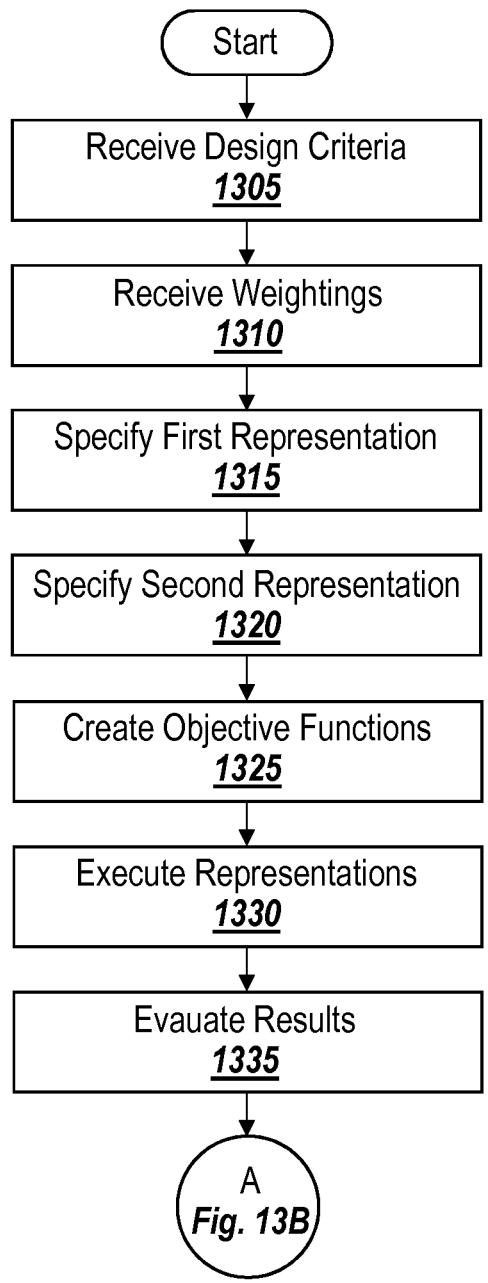
FIGS. 13A-13C illustrate exemplary processing for practicing an embodiment of the invention.
Figure 13B:
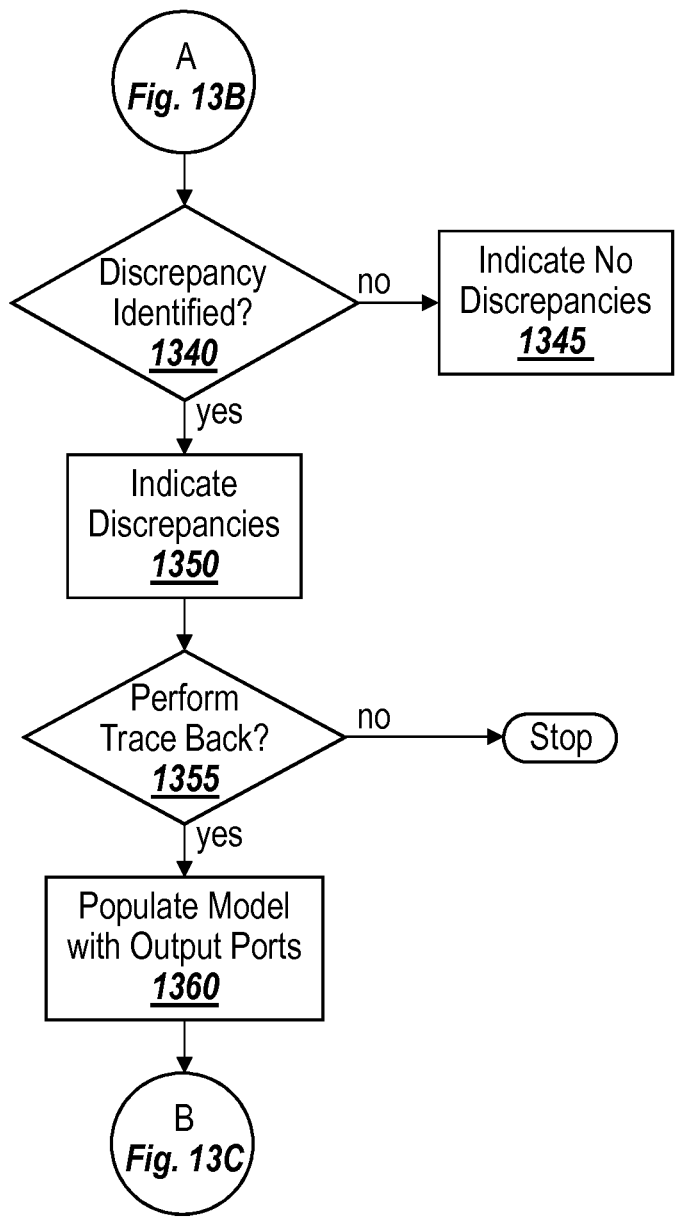
Figure 13C:
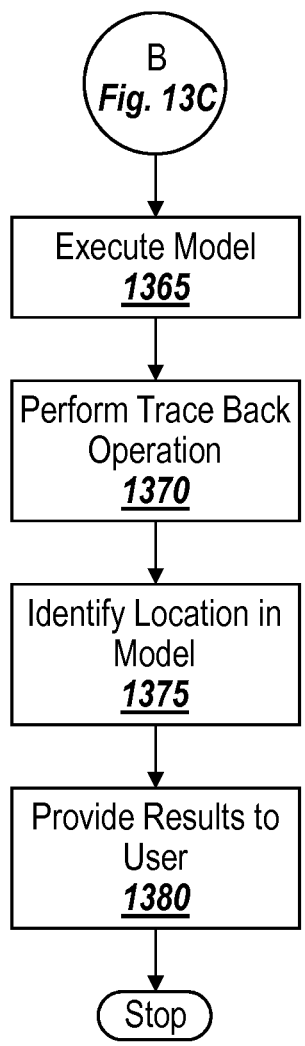

FIGS. 13A-C illustrate exemplary processing for practicing an embodiment of the invention. The processing acts of FIGS. 13A-C are exemplary and other acts can be used with or in place of those shown in FIGS. 13A-C without departing from the spirit of the invention.

Referring to FIG. 13A, design criteria may be received from a user via input device 120 (act 1305). Design criteria may specify an objective and/or constraint for use with one or more executable textual or graphical models. For example, a user may specify one or more of an accuracy goal, a speed goal, a memory footprint goal, a parameter for generated code, a specification for an output, a specification for a message string, a size goal, a cost goal, a power consumption goal, a working frequency range, a response parameter indicating a time interval for an error message, a correctness goal for a programming language associated with the model, a robustness parameter, a compiler switch, etc.

One or more weightings may be received from the user via input device 120 (act 1310). The weightings can be applied to the design criteria to weight the criteria according to preferences of a user. For example, a user may place a higher weighting on a memory footprint used by a component in a model as compared to a weighting for a processing time for the component. The user may then specify a first representation of a component, such as a block, (act 1315) and a second representation of the component (act 1320). The representations may represent designs versions, or variants, of the components. In an embodiment, the user may wish to compare the operation of one version of the component to another version of the component.

Objective functions may be created using the user entered design criteria and weightings (act 1325). In an embodiment, the objective functions may be used to evaluate the performance of the components being compared to each other. When desired, the objective functions can be subject to constraints specified by the user. The representations of the components may be executed against the objective functions (act 1330). For example, a first representation of the component may be in a first model and the second representation of the component may be in a second model. The two models may be executed and the operation of the two versions of the component may generate results that can be compared.

Results produced by the executed versions of the components and/or models can be evaluated (act 1335). In an embodiment, assessment tool 230 can be used to evaluate the results of components in a model. For example, a result from a default version of a block can be compared to the result produced by a modified version of the block once models containing the blocks have been executed. In an embodiment, executed components and/or models may produce generated code, intermediate results, etc., when a model is executed.

Referring now to FIG. 13B, when the results are evaluated, a determination may be made as to whether a discrepancy exists between a result produced by a default block and a modified block (act 1340). When no discrepancy exists, a message may be provided to a user, via display 110, indicating that no discrepancies are detected between the two results for the different versions of the block (act 1345). In contrast, when a discrepancy is identified between the two results, a message may be provided to the user indicating that a discrepancy is detected (act 1350).

When a discrepancy exists, a user may wish to perform trace back operations to identify the source of the discrepancy in a model. In an embodiment, a determination may be made as to whether a trace back operation should be performed (act 1355). When a user indicates that no trace back operation should be performed, processing may stop. In contrast, when a user indicates that a trace back operation should be performed, a model containing a block associated with the discrepancy may be populated with output ports via assessment tool 230 (act 1360). Populating a model with output ports may include placing output ports on blocks in the model. These output ports may be used to obtain output values from blocks in the model when the model executes. The output values for the blocks may be logged and used to determine whether a particular block in the model is contributing to, or is causing, a discrepancy in the model.

Referring now to FIG. 13C, a model containing a block associated with the output discrepancies may be executed once the model is populated with output ports (act 1365). A trace back operation can be performed on the model once the model is executed and output values are logged for blocks in the model via the output ports (act 1370). The trace back operation may traverse a model via output ports and may examine values of the output ports to determine which output port produced an erroneous value. The trace back operation may identify a location in a model, such as a block, responsible for producing a discrepancy (act 1375). A result of the trace back operation may be provided to a user when a source of a discrepancy is identified (act 1380). In an embodiment, output module 250 may provide information regarding the source of the discrepancy.

Exemplary Architecture

Figure 14:
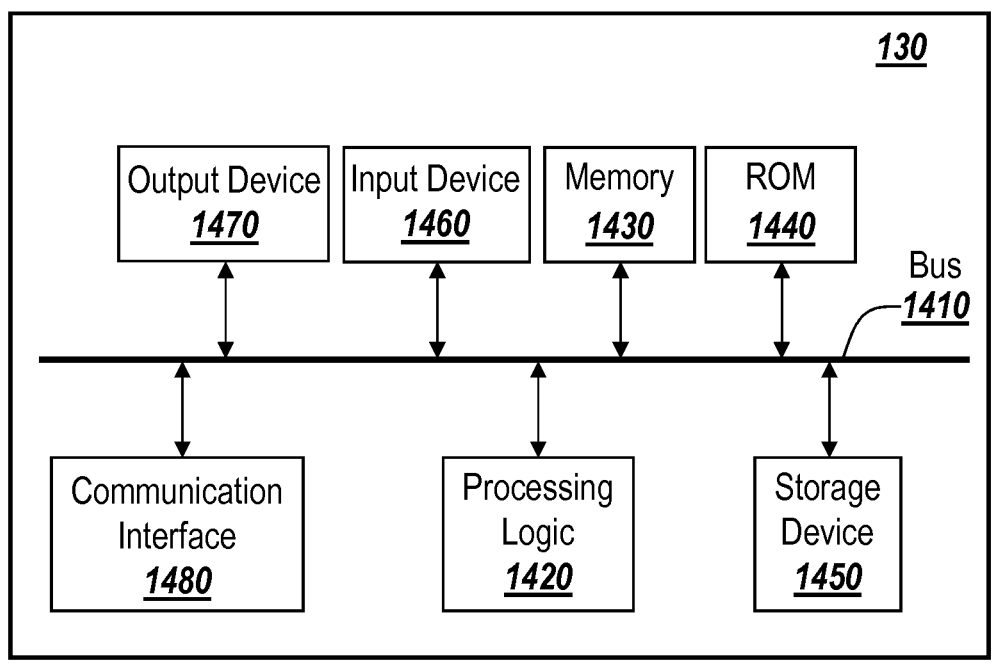
FIG. 14 illustrates an exemplary architecture for implementing the computer of FIG. 1.

FIG. 14 illustrates an exemplary computer architecture that can be used to implement computer 130 of FIG. 1. FIG. 14 is an exemplary diagram of an entity corresponding to computer 130. As illustrated, the entity may include a bus 1410, processing logic 1420, a main memory 1430, a read-only memory (ROM) 1440, a storage device 1450, an input device 1460, an output device 1470, and/or a communication interface 1480. Bus 1410 may include a path that permits communication among the components of the entity.

Processing logic 1420 may include a processor, microprocessor, or other types of processing logic (e.g., field programmable gate array (FPGA), graphics processing unit (GPU), digital signal processor (DSP), application specific integrated circuit (ASIC), etc.) that may interpret and execute instructions. For an implementation, processing logic 1420 may include a single core processor or a multi-core processor. In another implementation, processing logic 1420 may include a single processing device or a group of processing devices, such as a processing cluster or computing grid. In still another implementation, processing logic 1420 may include multiple processors that may be local or remote with respect each other, and may use one or more threads while processing.

Main memory 1430 may include a random access memory (RAM) or another type of dynamic storage device that may store information and instructions for execution by processing logic 1420. ROM 1440 may include a ROM device or another type of static storage device that may store static information and/or instructions for use by processing logic 1420. Storage device 1450 may include a magnetic, solid state and/or optical recording medium and its corresponding drive, or another type of static storage device that may store static information and/or instructions for use by processing logic 1420.

Input device 1460 may include logic that permits an operator to input information to the entity, such as a keyboard, a mouse, a pen, a touchpad, an accelerometer, a microphone, voice recognition, camera, neural interface, biometric mechanisms, etc. In an embodiment, input device 1460 may correspond to input device 120.

Output device 1470 may include a mechanism that outputs information to the operator, including a display, a printer, a speaker, a haptic interface, etc. In an embodiment, output device 1470 may correspond to display 110. Communication interface 1480 may include any transceiver-like logic that enables the entity to communicate with other devices and/or systems. For example, communication interface 1480 may include mechanisms for communicating with another device or system via a network.

The entity depicted in FIG. 14 may perform certain operations in response to processing logic 1420 executing software instructions stored in a computer-readable storage medium, such as main memory 1430. A computer-readable storage medium may be defined as a physical or logical memory device. The software instructions may be read into main memory 1430 from another computer-readable storage medium, such as storage device 1450, or from another device via communication interface 1480. The software instructions contained in main memory 1430 may cause processing logic 1420 to perform techniques described herein when the software instructions are executed on processing logic. Alternatively, hardwired circuitry may be used in place of or in combination with software instructions to implement techniques described herein. Thus, implementations described herein are not limited to any specific combination of hardware circuitry and software.

Although FIG. 14 shows exemplary components of the entity, in other implementations, the entity may contain fewer, different, or additional components than depicted in FIG. 14. In still other implementations, one or more components of the entity may perform one or more tasks described as being performed by one or more other components of the entity.

Exemplary Distributed Embodiment

Distributed embodiments may perform processing using two or more processing resources. For example, embodiments can perform processing using two or more cores in a single processing device, distribute processing across multiple processing devices installed within a single enclosure, and/or distribute processing across multiple types of processing logic connected by a network.

Figure 15:
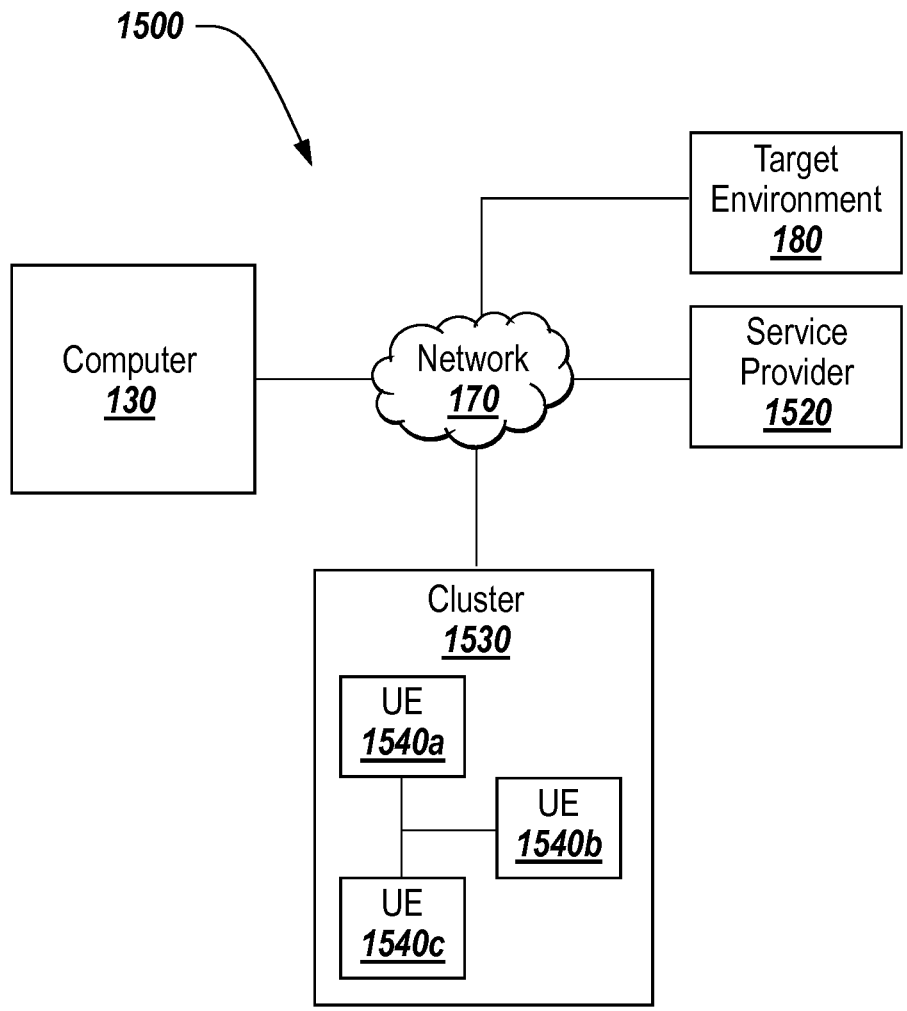
FIG. 15 illustrates an exemplary embodiment for implementing a distributed implementation of the invention.

FIG. 15 illustrates an exemplary system that can determine discrepancies between models using a distributed computing environment. System 1500 may include computer 130, network 170, service provider 1520, and cluster 1530. The implementation of FIG. 15 is exemplary and other distributed implementations of the invention may include more devices and/or entities, fewer devices and/or entities, and/or devices/entities in configurations that differ from the exemplary configuration of FIG. 15.

Service provider 1520 may include a device that makes a service available to another device. For example, service provider 1520 may include an entity that provides one or more services to a destination using a server and/or other devices. Services may include instructions that are executed by a destination to perform an operation. Alternatively, a service may include instructions that are executed on behalf of a destination to perform an operation on the destination's behalf.

Assume, for sake of example, that a service provider operates a web server that provides one or more web-based services to a destination, such as computer 130. The web-based services may allow computer 130 to perform distributed simulations of electrical and/or mechanical systems using hardware that is operated by the service provider. For example, a user of computer 130 may be allowed to evaluate models side-by-side using the service provider's hardware. In an implementation, a customer (user) may receive services on a subscription basis. A subscription may include substantially any type of arrangement, such as monthly subscription, a per-use fee, a fee based on an amount of information exchanged between service provider 1520 and the customer, a fee based on a number of processor cycles used by the customer, a fee based on a number of processors used by the customer, etc.

Cluster 1530 may include a group of processing devices, such as units of execution 1540 that can be used to perform remote processing (e.g., distributed processing, parallel processing, etc.). Units of execution 1540 may include hardware and/or hardware/software based devices that perform processing operations on behalf of a requesting device, such as computer 130. In an embodiment, units of execution 1540 may each compute a partial result and the partial results can be combined into an overall result for a model.

Embodiments operating in a standalone or in a distributed implementation can perform activities described herein on code/results associated with text-based computing and/or modeling applications, such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim.

Embodiments can further perform activities described herein on code/results associated with graphical modeling environments, such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from International Business Machines (IBM) Corporation; Ptolemy from the University of California at Berkeley; ASCET, CoWare, or aspects of a Unified Modeling Language (UML) or SysML environment. Graphical modeling environments can include block diagrams and/or other types of diagrams.

Embodiments may be implemented in a variety computing environments, such as environments that support statically or dynamically typed programming languages. For example, a dynamically typed language may be one used to express problems and/or solutions in mathematical notations familiar to those of skill in the relevant arts. For example, the dynamically typed language may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations. An exemplary embodiment that uses a dynamically typed language may be implemented in the Embedded MATLAB programming language that can be used to create code for use in embedded applications.

CONCLUSION

Implementations may allow a user to compare the operation of a first representation of a block against the operation of a second representation of the block.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 13A-C, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. For example, devices and/or entities may be added and/or removed from the implementations of FIG. 1, 2, 14, or 15 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. One or more non-transitory computer-readable storage media storing executable instructions that when executed on processing logic, cause the processing logic to:
   receive a user-specified design criteria specifying objectives or constraints for graphical models;
   receive a user input indicating a relative importance of the received user-specified design criteria;
   identify a block in a first graphical model, where:
      the block has a first representation in the first graphical model and a second representation in a second graphical model,
      the second graphical model is related to the first graphical model,
      the block includes a first function when the block is in the first graphical model, where the first function produces a first result when the first graphical model is executed, and
      the block includes a second function when the block is in the second graphical model, where the second function produces a second result when the second graphical model is executed;
   create one or more objective functions using the user-specified design criteria, where:
      the objective functions represent a desired performance for the first graphical model and the second graphical model when the first and second graphical models are executed, respectively,
      the objective functions are maximized or minimized subject to the constraints, and
      the objective functions define a measurement space for the block when the block is executed in the first graphical model and the second graphical model;
   execute the first graphical model to produce a first result;
   execute the second graphical model to produce a second result;
   compare the first result to the second result;
   identify a discrepancy between the first result and the second result; and
   graphically represent the first result, the second result, and information regarding the discrepancy, where:
      the graphically representing is performed using a display device, and
      the graphically representing indicates whether the first function or the second function satisfied the user-specified design criteria.

2. The media of claim 1, where the user-specified design criteria comprises one or more of:
   an accuracy goal,
   a speed goal,
   a memory footprint goal,
   a parameter for generated code,
   a specification for an output,
   a specification for a message string,
   a size goal,
   a cost goal,
   a power consumption goal,
   a working frequency range,
   a response parameter indicating a time interval for an error message,
   a correctness goal for a programming language associated with the model,
   a robustness parameter, and
   a compiler switch.

3. The media of claim 1, where the user-specified criteria identifies an acceptable behavior for the first graphical model or the second graphical model.

4. The media of claim 1, where the graphically representing includes one or more of:
   visualizing shape of the objective functions,
   displaying Pareto frontiers, and
   displaying sets of initial conditions.

5. The media of claim 1, where the measurement space is formed using variants of the block.

6. The media of claim 1, where the first graphical model is executed on a first simulation platform and the second graphical model is executed on a different simulation platform.

7. The media of claim 1, where a genetic algorithm is used to handle conflicts among the objective functions.

8. One or more non-transitory computer-readable storage media storing executable instructions that when executed on processing logic, cause the processing logic to:
execute a first graphical model to produce a first output value for a first representation of a block;
augment a second representation of the block, where the second representation is in a second graphical model, where:
the second representation is augmented with an output port,
one or more other blocks in the second graphical model are augmented with output ports, and
the output ports allow monitoring of the second representation of the block and of the one or more other blocks when the second graphical model is executing;
execute the second graphical model to produce a second output value for the second representation of the block;
display the first output value and the second output value, where:
the displaying indicates a discrepancy between the first output value and the second output value;
identify the discrepancy by performing a trace-back operation in the second graphical model, where the trace-back operation includes:
evaluating the output port of the second representation,
evaluating an output port of blocks providing a value to the second representation, and
determining a source of the discrepancy in the second graphical model based on the evaluating; and
provide information about the source of the discrepancy.

9. The media of claim 8, where the providing includes:
indicating a location in the second graphical model, where the location is the source of the discrepancy.

10. The media of claim 8, where the first graphical model is executed in a first simulation environment and the second graphical model is executed in a second simulation environment.

11. The media of claim 8, where:
the first representation includes a default function, and
the second representation includes a customer provided function.

12. One or more non-transitory computer-readable storage media holding executable instructions that when executed on processing logic, cause the processing logic to:
receive an input identifying objectives and constraints for evaluating performance of a design, where:
the design is represented in a baseline version via a first model,
the design is represented in a modified version via a second model,
the objectives include a first objective and a second objective,
the first objective conflicts with the second objective such that satisfying the first objective inhibits satisfying the second objective, and
the first objective and the second objective have user-specified weightings that indicate importance of the first objective with respect to the second objective;
identify a measurement space using the objectives and the constraints, the measurement space including objective functions that include the objectives, where:
the objective functions are subject to the constraints;
execute the first model and the second model over the measurement space to produce a first result for the first model and a second result for the second model; and
display:
the first result,
the second result, and
information about the objective functions, where:
the displaying indicates whether the baseline version of the model or the modified version of the model satisfies the objectives subject to the constraints.

13. The media of claim 12, where:
the baseline model includes a block that differs from a corresponding block in the modified version of the model.

14. The media of claim 13, where:
the block in the baseline model represents a default algorithm and the corresponding block in the modified version of the model represents a modified algorithm.

15. The media of claim 12, where:
the information about objective functions includes:
shapes of the objective functions, or
Pareto frontiers.

16. The media of claim 12, where the displaying further comprises:
indicating a location in the modified version of the model where a result is outside a determined range.

17. A computer-implemented method comprising:
receiving a user-specified design criteria specifying objectives or constraints for graphical models;
receiving an input indicating a relative importance of the received user-specified design criteria;
identifying a block in a first graphical model, where:
the block has a first representation in the first graphical model and a second representation in a second graphical model,
the second graphical model is related to the first graphical model,
the block includes a first function when the block is in the first graphical model, where the first function produces a first result when the first graphical model is executed, and
the block includes a second function when the block is in the second graphical model, where the second function produces a second result when the second graphical model is executed;
creating one or more objective functions using the user-specified design criteria, where:
the objective functions represent a desired performance for the first graphical model and the second graphical model when the first and second graphical models are executed, respectively,
the objective functions are maximized or minimized subject to the constraints, and
the objective functions define a measurement space for the block when the block is executed in the first graphical model and the second graphical model;
executing the first graphical model to produce a first result;
executing the second graphical model to produce a second result;
comparing the first result to the second result;
identifying a discrepancy between the first result and the second result; and graphically representing the first result, the second result, and information regarding the discrepancy, where:
the graphically representing is performed using a display device, and
the graphically representing indicates whether the first function or the second function satisfied the user-specified design criteria.

18. A computer-implemented method comprising:
executing a first graphical model to produce a first output value for a first representation of a block;
augmenting a second representation of the block, where the second representation is in a second graphical model, where:
the second representation is augmented with an output port,
one or more other blocks in the second graphical model are augmented with output ports, and
the output ports allow monitoring of the second representation of the block and of the one or more other blocks when the second graphical model is executing;
executing the second graphical model to produce a second output value for the second representation of the block;
displaying the first output value and the second output value, where:
the displaying indicates a discrepancy between the first output value and the second output value;
identifying the discrepancy by performing a trace-back operation in the second graphical model, where the trace-back operation includes:
evaluating the output port of the second representation,
evaluating an output port of blocks providing a value to the second representation, and
determining a source of the discrepancy in the second graphical model based on the evaluating; and
providing information about the source of the discrepancy.

19. A computer-implemented method comprising:
receiving an input identifying objectives and constraints for evaluating performance of a design, where:
the design is represented in a baseline version via a first model,
the design is represented in a modified version via a second model,
the objectives include a first objective and a second objective,
the first objective conflicts with the second objective such that satisfying the first objective inhibits satisfying the second objective, and
the first objective and the second objective have user-specified weightings that indicate the importance of the first objective with respect to the second objective;
identifying a measurement space using the objectives and the constraints, the measurement space including objective functions that include the objectives, where:
the objective functions are subject to the constraints;
executing the first model and the second model over the measurement space to produce a first result for the first model and a second result for the second model; and
displaying:
the first result,
the second result, and
information about the objective functions, where:
the displaying indicates whether the baseline version of the model or the modified version of the model satisfies the objectives subject to the constraints.

20. A system comprising:
an interface for:
receiving an input identifying objectives and constraints for evaluating performance of a design, where:
the design is represented in a baseline version via the first model,
the design is represented in a modified version via the second model,
the objectives include a first objective and a second objective,
the first objective conflicts with the second objective such that satisfying the first objective inhibits satisfying the second objective, and
the first objective and the second objective have user-specified weightings that indicate the importance of the first objective with respect to the second objective;
a processor for:
identifying a measurement space using the objectives and the constraints, the measurement space including objective functions that include the objectives, where:
the objective functions are subject to the constraints;
executing the first model and the second model over the measurement space to produce a first result for the first model and a second result for the second model; and
a display for:
displaying:
the first result,
the second result, and
information about the objective functions, where:
the displaying indicates whether the baseline version of the model or the modified version of the model satisfies the objectives subject to the constraints.

* * * * *

UNITED STATES PATENT AND TRADEMARK OFFICE
CERTIFICATE OF CORRECTION

PATENT NO. : 9,558,301 B1  
APPLICATION NO. : 13/965921  
DATED : January 31, 2017  
INVENTOR(S) : Orqueda et al.

Page 1 of 1

It is certified that error appears in the above-identified patent and that said Letters Patent is hereby corrected as shown below:

On the Title Page

Item [74], Column 2, in "Attorney, Agent or Firm", Line 1, after "Riley" insert --&--.

Signed and Sealed this  
Twenty-eighth Day of March, 2017

Michelle K. Lee  
*Director of the United States Patent and Trademark Office*